(12) United States Patent
Hsu et al.

(10) Patent No.: US 10,796,063 B2
(45) Date of Patent: Oct. 6, 2020

(54) MAPPING OF PATTERNS BETWEEN DESIGN LAYOUT AND PATTERNING DEVICE

(71) Applicant: ASML NETHERLANDS B.V., Veldhoven (NL)

(72) Inventors: Duan-Fu Stephen Hsu, Fremont, CA (US); Jingjing Liu, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/093,401

(22) PCT Filed: Apr. 4, 2017

(86) PCT No.: PCT/EP2017/057931
§ 371 (c)(1),
(2) Date: Oct. 12, 2018

(87) PCT Pub. No.: WO2017/178276
PCT Pub. Date: Oct. 19, 2017

(65) Prior Publication Data
US 2019/0130060 A1    May 2, 2019

Related U.S. Application Data

(60) Provisional application No. 62/322,677, filed on Apr. 14, 2016.

(51) Int. Cl.
*G06F 30/398*   (2020.01)
*G06F 30/20*    (2020.01)
(Continued)

(52) U.S. Cl.
CPC .............. *G06F 30/398* (2020.01); *G03F 1/16* (2013.01); *G03F 1/36* (2013.01); *G03F 1/70* (2013.01);
(Continued)

(58) Field of Classification Search
USPC .......................................................... 716/51
See application file for complete search history.

(56) References Cited

U.S. PATENT DOCUMENTS

| 5,229,872 A | 7/1993 | Mumola |
| 5,296,891 A | 3/1994 | Vogt et al. |

(Continued)

FOREIGN PATENT DOCUMENTS

WO    2010059954    5/2010

OTHER PUBLICATIONS

International Search Report and Written Opinion issued in PCT Patent Application No. PCT/EP2017/057931, dated Jul. 3, 2017.
(Continued)

*Primary Examiner* — Bryce M Aisaka
(74) *Attorney, Agent, or Firm* — Pillsbury Winthrop Shaw Pittman LLP

(57) ABSTRACT

A method including obtaining at least a clip of a design layout, and determining a representation of the clip on a patterning device, under a condition that a reduction ratio from the representation to the clip is anisotropic. A method including obtaining a relationship between a first geometric characteristic in a design layout or an image thereof, and a second geometric characteristic in a representation of the design layout on a patterning device, wherein the relationship is a function involving reduction ratios in two different directions.

20 Claims, 21 Drawing Sheets

(51) Int. Cl.
G03F 1/36 (2012.01)
G03F 7/20 (2006.01)
G03F 1/00 (2012.01)
G03F 1/70 (2012.01)

(52) U.S. Cl.
CPC ...... *G03F 7/70433* (2013.01); *G03F 7/70441* (2013.01); *G06F 30/20* (2020.01)

(56) References Cited

U.S. PATENT DOCUMENTS

| | | | |
|---|---|---|---|
| 5,523,193 | A | 6/1996 | Nelson |
| 5,969,441 | A | 10/1999 | Loopstra et al. |
| 6,046,792 | A | 4/2000 | Van Der Werf et al. |
| 7,587,704 | B2 | 9/2009 | Ye et al. |
| 2005/0076322 | A1 | 4/2005 | Ye et al. |
| 2006/0269848 | A1* | 11/2006 | Setta ............... G03F 1/36 430/5 |
| 2009/0157360 | A1 | 6/2009 | Ye et al. |
| 2010/0315614 | A1 | 12/2010 | Hansen |
| 2011/0099526 | A1 | 4/2011 | Liu |

OTHER PUBLICATIONS

Van Schoot, Jan, et al.: "EUV High-NA scanner and mask optimization for sub 8 nm resolution", Proc. of SPIE, vol. 9635, Oct. 23, 2015.

Benk, Markus P., et al.: "Emulation of anamorphic imaging on the SHARP EUV mask microscope", Proc. of SPIE, vol. 9776, Mar. 18, 2016.

Kim, In-Seon, et al.: "Non-isotropic shadow effect with various pattern direction in anamorphic high numerical aperture system", Proc. of SPIE, vol. 9776, Mar. 18, 2016.

Van Ingen Schenau, Koen, et al.: "Imaging performance of the EUV high NA anamorphic system", Proc. of SPIE, vol. 9661, Sep. 4, 2015.

Civay, D., et al..: "EUV telecentricity and shadowing errors impact on process margins", Proc. of SPIE, vol. 9422, Mar. 13, 2015.

Wood, Obert, et al.: "Improved Ru/Si multilayer reflective coatings for advanced extreme ultraviolet lithography photomasks", Proc. of SPIE, vol. 9776, Mar. 18, 2016.

Van Schoot, Jan, et al.: "EUV lithography scanner for sub 8nm resolution", Proc. of SPIE, vol. 9422, Mar. 13, 2015.

Neumann, Jens Timo, et al.: "Imaging performance of EUV lithography optics configuration for sub 9nm resolution", Proc. of SPIE, vol. 9422, Mar. 13, 2015.

Rosenbluth, A.E., et al.: "Optimum mask and source patterns to print a given shape", Proc. of SPIE, vol. 4376, pp. 486-502, 2001.

Socha, Robert, et al.: "Simultaneous Source Mask Optimization (SMO)", Proc. of SPIE, vol. 5853, pp. 180-193, 2005.

Granik, Yuri: "Source optimization for image fidelity and throughput", Journal of Microlithography, Microfabrication, Microsystems 3(4), Oct. 2004, pp. 509-522.

Cao, Yu, et al.: "Optimized Hardware and Software for Fast, Full Chip Simulation", Proc. of SPIE, vol. 5754, 2005, pp. 407-414.

Spence, Chris: "Full-Chip Lithography Simulation and Design Analysis—How OPC is changing IC Design", Proc. of SPIE, vol. 5751, pp. 1-14, 2005.

* cited by examiner

MAPPING OF PATTERNS BETWEEN DESIGN LAYOUT AND PATTERNING DEVICE

CROSS-REFERENCE TO RELATED APPLICATIONS

This application is the U.S. national phase entry of PCT patent application no. PCT/EP2017/057931, which was filed on Apr. 4, 2017, which claims the benefit of priority of U.S. provisional application 62/322,677, which was filed on Apr. 14, 2016, and which is incorporated herein in its entirety by reference.

TECHNICAL FIELD

The description herein relates to lithography apparatuses and processes.

BACKGROUND

Manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step using a patterning apparatus, such as optical and/or nanoimprint lithography using a lithographic apparatus, to provide a pattern on a substrate and typically, but optionally, involves one or more related pattern processing steps, such as resist development by a development apparatus, baking of the substrate using a bake tool, etching using the pattern using an etch apparatus, etc. Further, one or more metrology processes are involved in the patterning process.

Metrology processes are used at various steps during a patterning process to monitor and control the process. For example, metrology processes are used to measure one or more characteristics of a substrate, such as a relative location (e.g., registration, overlay, alignment, etc.) or dimension (e.g., line width, critical dimension (CD), thickness, etc.) of features formed on the substrate during the patterning process, such that, for example, the performance of the patterning process can be determined from the one or more characteristics. If the one or more characteristics are unacceptable (e.g., out of a predetermined range for the characteristic(s)), the measurements of the one or more characteristics may be used to alter one or more parameters of the patterning process such that further substrates manufactured by the patterning process have an acceptable characteristic(s).

A lithography apparatus can be used, for example, in the manufacture of integrated circuits (ICs). In such a case, a patterning device (e.g., a mask) may contain or provide a circuit pattern corresponding to an individual layer of the IC ("design layout"), and this circuit pattern can be transferred onto a target portion (e.g. comprising one or more dies) on a substrate (e.g., silicon wafer) that has been coated with a layer of radiation-sensitive material ("resist"), by methods such as irradiating the target portion through the circuit pattern on the patterning device. In general, a single substrate contains a plurality of adjacent target portions to which the circuit pattern is transferred successively by the lithography apparatus, one target portion at a time. In one type of lithography apparatuses, the circuit pattern on the entire patterning device is transferred onto one target portion in one go; such an apparatus is commonly referred to as a wafer stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the circuit pattern on the patterning device are transferred to one target portion progressively. Since, in general, the lithography apparatus will have a reduction ratio M (e.g., 4), the speed F at which the substrate is moved will be a factor 1/M times that at which the projection beam scans the patterning device. More information with regard to lithographic devices as described herein can be gleaned, for example, from U.S. Pat. No. 6,046,792, incorporated herein by reference.

Prior to transferring the circuit pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred circuit pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

As noted, microlithography is a central step in the manufacturing of ICs, where patterns formed on substrates define functional elements of the ICs, such as microprocessors, memory chips etc. Similar lithographic techniques are also used in the formation of flat panel displays, micro-electro mechanical systems (MEMS) and other devices.

SUMMARY

Disclosed herein is a method comprising: obtaining at least a clip of a design layout; and determining a representation of the clip on a patterning device, under a condition that a reduction ratio from the representation to the clip is anisotropic.

According to an embodiment, the patterning device is a reflective patterning device.

According to an embodiment, the patterning device is a transmissive patterning device.

According to an embodiment, the patterning device is programmable.

According to an embodiment, the method further comprises making or configuring the patterning device, based on the representation.

According to an embodiment, the method further comprises measuring the patterning device made or configured.

According to an embodiment, measuring the patterning device comprises measuring a cutline length on a feature in the representation.

According to an embodiment, measuring the patterning device comprises measuring a critical dimension (CD) on a feature in the representation.

According to an embodiment, measuring the patterning device comprises measuring a angle on a feature in the representation.

According to an embodiment, the method further comprises simulating an image formed on a substrate by projecting the representation onto the substrate.

According to an embodiment, the image is a resist image, an aerial image, or an etched image.

According to an embodiment, simulating the image comprises modeling a source or projection optics of a patterning apparatus, or modeling interaction of light from the source with features in the representation.

According to an embodiment, the method further comprises adjusting a patterning apparatus or a patterning process based on the simulated image.

According to an embodiment, adjusting the patterning apparatus comprises adjusting a source or projection optics of a lithography apparatus.

According to an embodiment, adjusting the patterning process comprises adjusting a metric selected from a group consisting of focus, dose, scan speed, development, PEB, etching, and a combination thereof.

According to an embodiment, the method further comprises determining an interaction of light with the patterning device based on the representation.

According to an embodiment, the interaction is scattering due to a finite height of features in the representation.

According to an embodiment, the interaction is absorption of the light by features in the representation.

According to an embodiment, the method further comprises adjusting a patterning apparatus or a patterning process based on the interaction.

According to an embodiment, adjusting the patterning apparatus comprises adjusting a source or projection optics of a lithography apparatus.

According to an embodiment, adjusting the patterning process comprises adjusting a metric selected from a group consisting of focus, dose, scan speed, development, PEB, etching, and a combination thereof.

According to an embodiment, the method further comprises adjusting a patterning apparatus or a patterning process based on the representation.

According to an embodiment, adjusting the patterning apparatus comprises adjusting a source or projection optics of a lithography apparatus.

According to an embodiment, adjusting the patterning process comprises adjusting a metric selected from a group consisting of focus, dose, scan speed, development, PEB, etching, and a combination thereof.

Disclosed herein is a method comprising: obtaining a relationship between: a first geometric characteristic in a design layout or an image thereof, and a second geometric characteristic in a representation of the design layout on a patterning device; wherein the relationship is a function of an angle or an orientation of the first geometric characteristic, or a function of an angle or an orientation of the second geometric characteristic.

Disclosed herein is a method comprising: obtaining a relationship between: a first geometric characteristic in a design layout or an image thereof, and a second geometric characteristic in a representation of the design layout on a patterning device; wherein the relationship is a function involving reduction ratios in two different directions.

According to an embodiment, the relationship is also between the first geometric characteristic and a fourth geometric characteristic in the representation of the design layout, or wherein the relationship is also between a third geometric characteristic in the design layout and the second geometric characteristic.

According to an embodiment, the first geometric characteristic comprises a cutline length, a CD, or a change of CD.

According to an embodiment, the second geometric characteristic comprises a cutline length, a CD, or a change of CD.

According to an embodiment, the method further comprises: obtaining a value of the second geometric characteristic; determining a value of the first geometric characteristic from the value of the second geometric characteristic, using the relationship.

According to an embodiment, the method further comprises adjusting a patterning apparatus or a patterning process based on the value of the first geometric characteristic.

According to an embodiment, adjusting the patterning apparatus comprises adjusting a source or projection optics of a lithography apparatus.

According to an embodiment, adjusting the design layout or the representation based on the value of the first geometric characteristic.

According to an embodiment, the method further comprises determining a location of measurement on the design layout or the image, based on the value of the first geometric characteristic.

According to an embodiment, the method further comprises: obtaining a value of the first geometric characteristic; determining a value of the second geometric characteristic from the value of the second geometric characteristic, using the relationship.

According to an embodiment, the method further comprises determining an interaction of light with the patterning device based on the value of the second geometric characteristic.

According to an embodiment, the method further comprises adjusting a patterning apparatus or a patterning process based on the value of the second geometric characteristic.

According to an embodiment, adjusting the patterning apparatus comprises adjusting a source or projection optics of a lithography apparatus.

Disclosed herein is a computer program product comprising a non-transitory computer readable medium having instructions recorded thereon, the instructions when executed by a computer implementing any of the above methods.

BRIEF DESCRIPTION OF THE DRAWINGS

The above aspects and other aspects and features will become apparent to those ordinarily skilled in the art upon review of the following description of specific embodiments in conjunction with the accompanying figures, wherein.

DETAILED DESCRIPTION

Figure 1A:
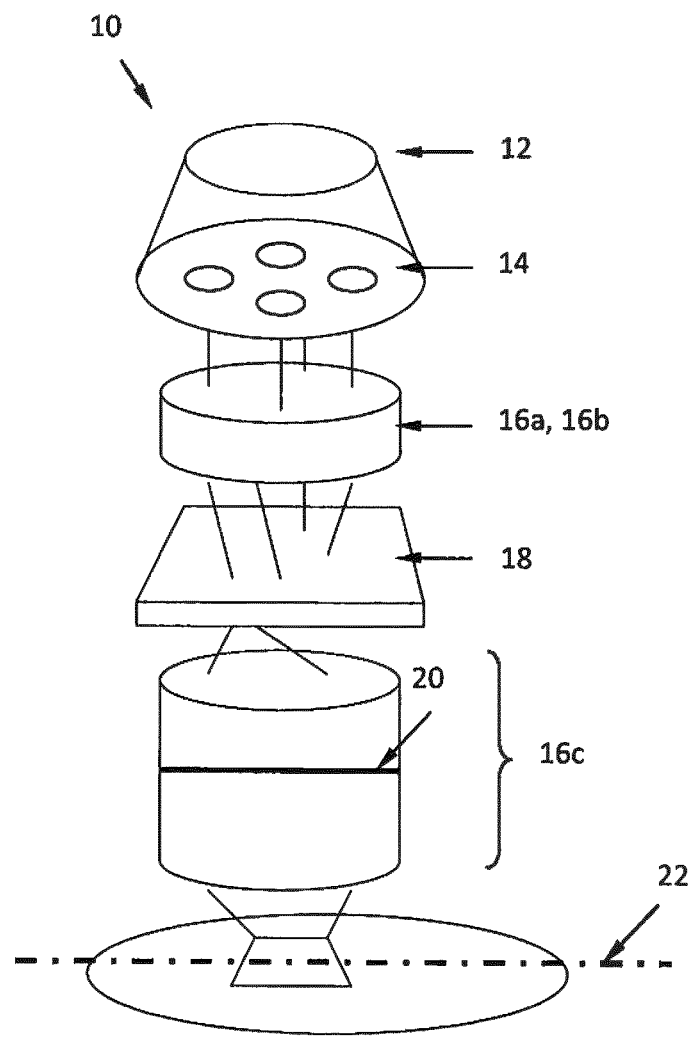
FIG. 1A is a block diagram of various subsystems of a lithography system according to an embodiment.

Embodiments will now be described in detail with reference to the drawings, which are provided as illustrative examples so as to enable those skilled in the art to practice the embodiments. Notably, the figures and examples below are not meant to limit the scope to a single embodiment, but other embodiments are possible by way of interchange of some or all of the described or illustrated elements. Wherever convenient, the same reference numbers will be used throughout the drawings to refer to same or like parts. Where certain elements of these embodiments can be partially or fully implemented using known components, only those portions of such known components that are necessary for an understanding of the embodiments will be described, and detailed descriptions of other portions of such known components will be omitted so as not to obscure the description of the embodiments. In the present specification, an embodiment showing a singular component should not be considered limiting; rather, the scope is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the scope encompasses present and future known equivalents to the components referred to herein by way of illustration.

As semiconductor manufacturing processes continue to advance, the dimensions of functional elements have continually been reduced while the amount of functional elements, such as transistors, per device has been steadily increasing over decades, following a trend commonly referred to as "Moore's law". At the current state of technology, layers of devices are manufactured using lithography apparatuses that project a design layout onto a substrate using illumination from a deep-ultraviolet (e.g., 13.52 nm) illumination source or an extreme-ultraviolet illumination source, creating individual functional elements having dimensions well below 30 nm.

This process in which features with dimensions smaller than the classical resolution limit of a lithography apparatus are printed, is commonly known as low-$k_1$ lithography, according to the resolution formula $CD=k_1 \times \lambda/NA$, where $\lambda$ is the wavelength of radiation employed (currently in most cases 248 nm or 193 nm), NA is the numerical aperture of projection optics in the lithography apparatus, CD is the "critical dimension"—generally the smallest feature size printed—and $k_1$ is an empirical resolution factor. In general, the smaller $k_1$ the more difficult it becomes to reproduce a pattern on the substrate that resembles the shape and dimensions planned by a circuit designer in order to achieve particular electrical functionality and performance. To overcome these difficulties, sophisticated fine-tuning steps are applied to the lithography apparatus and/or design layout. These include, for example, but not limited to, optimization of NA and optical coherence settings, customized illumination schemes, use of phase shifting patterning devices, optical proximity correction (OPC, sometimes also referred to as "optical and process correction") in the design layout, or other methods generally defined as "resolution enhancement techniques" (RET). The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithography apparatus, no matter where the optical component is located on an optical path of the lithography apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

As an example, OPC addresses the fact that the final size and placement of an image of the design layout projected on the substrate will not be identical to, or simply depend only on the size and placement of the design layout as represented on the patterning device. It is noted that the terms "mask", "reticle", "patterning device" are utilized interchangeably herein and may include both transmissive and reflective patterning devices. For the small feature sizes and high feature densities present on some design layout, the position of a particular edge of a given feature will be influenced to a certain extent by the presence or absence of other adjacent features. These proximity effects arise from minute amounts of radiation coupled from one feature to another and/or non-geometrical optical effects such as diffraction and interference. Similarly, proximity effects may arise from diffusion and other chemical effects during post-exposure bake (PEB), resist development, and etching that generally follow lithography.

In order to ensure that the projected image of the design layout is in accordance with requirements of a given target circuit design, proximity effects need to be predicted and compensated for, using sophisticated numerical models, corrections or pre-distortions of the design layout. The article "Full-Chip Lithography Simulation and Design Analysis—How OPC Is Changing IC Design", C. Spence, Proc. SPIE, Vol. 5751, pp 1-14 (2005) provides an overview of current "model-based" optical proximity correction processes. In a typical high-end design almost every feature of the design layout has some modification in order to achieve high fidelity of the projected image to the target design. These modifications may include shifting or biasing of edge positions or line widths as well as application of "assist" features that are intended to assist projection of other features.

Application of model-based OPC to a target design involves good process models and considerable computational resources, given the many millions of features typically present in a chip design. However, applying OPC is generally not an exact science, but an empirical, iterative process that does not always compensate for all possible proximity effect. Therefore, effect of OPC, e.g., design layouts after application of OPC and any other RET, need to be verified by design inspection, i.e. intensive full-chip simulation using calibrated numerical process models, in order to minimize the possibility of design flaws being built into the patterning device pattern. This is driven by the enormous cost of making high-end patterning devices, which run in the multi-million dollar range, as well as by the impact on turn-around time by reworking or repairing actual patterning devices once they have been manufactured.

One of the simplest forms of OPC is selective bias. Given a CD vs. pitch curve, all of the different pitches could be forced to produce the same CD, at least at best focus and exposure, by changing the CD at the mask level. Thus, if a feature prints too small at the wafer level, the mask level feature would be biased to be slightly larger than nominal, and vice versa. Since the pattern transfer process from mask level to wafer level is non-linear, the amount of bias is not simply the measured CD error at best focus and exposure times the reduction ratio M, but with modeling and experimentation an appropriate bias can be determined. Selective bias is an incomplete solution to the problem of proximity effects, particularly if it is only applied at the nominal process condition. Even though such bias could, in principle, be applied to give uniform CD vs. pitch curves at best focus and exposure, once the exposure process varies from the nominal condition, each biased pitch curve will respond differently, resulting in different process windows for the different features. Therefore, the "best" bias to give identical CD vs. pitch may even have a negative impact on the overall process window, reducing rather than enlarging the focus and exposure range within which all of the target features print on the wafer within the desired process tolerance.

Other more complex OPC techniques have been developed for application beyond the one-dimensional bias example above. A two-dimensional proximity effect is line end shortening. Line ends have a tendency to "pull back" from their desired end point location as a function of exposure and focus. In many cases, the degree of end shortening of a long line end can be several times larger than the corresponding line narrowing. This type of line end pull back can result in catastrophic failure of the devices being manufactured if the line end fails to completely cross over the underlying layer it was intended to cover, such as a polysilicon gate layer over a source-drain region. Since this type of pattern is highly sensitive to focus and exposure, simply biasing the line end to be longer than the design length is inadequate because the line at best focus and exposure, or in an underexposed condition, would be excessively long, resulting either in short circuits as the extended line end touches neighboring structures, or unnecessarily large circuit sizes if more space is added between individual features in the circuit. Since one of the key goals of integrated circuit design and manufacturing is to maximize the number of functional elements while minimizing the area required per chip, adding excess spacing is a highly undesirable solution.

Two-dimensional OPC approaches may help solve the line end pull back problem. Extra structures (also known as "assist features") such as "hammerheads" or "serifs" may be added to line ends to effectively anchor them in place and provide reduced pull back over the entire process window. Even at best focus and exposure these extra structures are not resolved but they alter the appearance of the design feature without being fully resolved on their own. A "design feature" as used herein means a feature intended to print on a wafer under some or all conditions in the process window and having some function in the circuits eventually produced. Assist features can take on much more aggressive forms than simple hammerheads added to line ends, to the extent the pattern on the mask is no longer simply the desired wafer pattern upsized by the inverse of the reduction ratio M. Assist features such as serifs can be applied to many more cases than simply reducing line end pull back. Inner or outer serifs can be applied to any edge, especially two dimensional edges, to reduce corner rounding or edge extrusions. With enough selective biasing and assist features of all sizes and polarities, the features on the mask bear less and less of a resemblance to the final pattern desired at the wafer level. In general, the mask pattern becomes a pre-distorted version of the wafer-level pattern, where the distortion is intended to counteract or reverse the pattern deformation that will occur during the lithography process to produce a pattern on the wafer that is as close to the one intended by the designer as possible.

Another OPC technique involves using completely independent and non-resolvable assist features, instead of or in addition to those assist features (e.g., serifs) connected to the design features. The term "independent" here means that edges of these assist features are not connected to edges of the design features. These independent assist features are not intended or desired to print as features on the wafer, but rather are intended to modify the aerial image of a nearby design feature to enhance the printability and process tolerance of that design feature. These assist features (often referred to as "scattering bars" or "SBAR") can include sub-resolution assist features (SRAF) which are features outside edges of the design features and sub-resolution inverse features (SRIF) which are features scooped out from inside the edges of the design features. The presence of SBAR adds yet another layer of complexity to a mask. A simple example of a use of scattering bars is where a regular array of non-resolvable scattering bars is drawn on both sides of an isolated line feature, which has the effect of making the isolated line appear, from an aerial image standpoint, to be more representative of a single line within an array of dense lines, resulting in a process window much closer in focus and exposure tolerance to that of a dense pattern. The common process window between such a decorated isolated feature and a dense pattern will have a larger common tolerance to focus and exposure variations than that of a feature drawn as isolated at the mask level.

Both OPC and full-chip RET verification may be based on numerical modeling systems and methods as described, for example in, U.S. patent application Ser. No. 10/815,573 and an article titled "Optimized Hardware and Software For Fast, Full Chip Simulation", by Y. Cao et al., Proc. SPIE, Vol. 5754, 405 (2005).

One RET is related to adjustment of the global bias of the design layout. The global bias is the difference between the patterns in the design layout and the patterns intended to print on the substrate. For example, a circular pattern of 25 nm diameter may be printed on the substrate by a 50 nm diameter pattern in the design layout or by a 20 nm diameter pattern in the design layout but with high dose.

In addition to optimization to design layouts or patterning devices (e.g., OPC), the illumination source can also be optimized, either jointly with patterning device optimization or separately, in an effort to improve the overall lithography fidelity. The terms "illumination source" and "source" are used interchangeably in this document. Since the 1990s, many off-axis illumination sources, such as annular, quadrupole, and dipole, have been introduced, and have provided more freedom for OPC design, thereby improving the imaging results, As is known, off-axis illumination is a proven way to resolve fine structures (i.e., target features) contained in the patterning device. However, when compared to a traditional illumination source, an off-axis illumination source usually provides less radiation intensity for the aerial image (AI). Thus, it becomes desirable to attempt to optimize the illumination source to achieve the optimal balance between finer resolution and reduced radiation intensity.

Numerous illumination source optimization approaches can be found, for example, in an article by Rosenbluth et al., titled "Optimum Mask and Source Patterns to Print A Given Shape", Journal of Microlithography, Microfabrication, Microsystems 1(1), pp. 13-20, (2002). The source is partitioned into several regions, each of which corresponds to a certain region of the pupil spectrum. Then, the source distribution is assumed to be uniform in each source region and the brightness of each region is optimized for process window. However, such an assumption that the source distribution is uniform in each source region is not always valid, and as a result the effectiveness of this approach suffers. In another example set forth in an article by Granik, titled "Source Optimization for Image Fidelity and Throughput", Journal of Microlithography, Microfabrication, Microsystems 3(4), pp. 509-522, (2004), several existing source optimization approaches are overviewed and a method based on illuminator pixels is proposed that converts the source optimization problem into a series of non-negative least square optimizations. Though these methods have demonstrated some successes, they typically require multiple complicated iterations to converge. In addition, it may be difficult to determine the appropriate/optimal values for some extra parameters, such as γ in Granik's method, which dictates the trade-off between optimizing the source for substrate image fidelity and the smoothness requirement of the source.

For low $k_1$ photolithography, optimization of both the source and patterning device is useful to ensure a viable process window for projection of critical circuit patterns. Some algorithms (e.g. Socha et. al. Proc. SPIE vol. 5853, 2005, p. 180) discretize illumination into independent source points and mask into diffraction orders in the spatial frequency domain, and separately formulate a cost function (which is defined as a function of selected design variables) based on process window metrics such as exposure latitude which could be predicted by optical imaging models from source point intensities and patterning device diffraction orders. The term "design variables" as used herein comprises a set of parameters of a lithography apparatus, for example, parameters a user of the lithography apparatus can adjust. It should be appreciated that any characteristics of a lithographic projection process, including those of the source, the patterning device, the projection optics, and/or resist characteristics can be among the design variables in the optimization. The cost function is often a non-linear function of the design variables. Then standard optimization techniques are used to minimize the cost function.

Relatedly, the pressure of ever decreasing design rules have driven semiconductor chipmakers to move deeper into the low $k_1$ lithography era with existing 193 nm ArF lithography. Lithography towards lower $k_1$ puts heavy demands on RET, exposure tools, and the need for litho-friendly design. 1.35 ArF hyper numerical aperture (NA) exposure tools may be used in the future. To help ensure that circuit design can be produced on to the substrate with workable process window, source-patterning device optimization (referred to herein as source-mask optimization or SMO) is becoming a significant RET for 2× nm node.

A source and patterning device (design layout) optimization method and system that allows for simultaneous optimization of the source and patterning device using a cost function without constraints and within a practicable amount of time is described in a commonly assigned International Patent Application No. PCT/US2009/065359, filed on Nov. 20, 2009, and published as WO2010/059954, titled "Fast Freeform Source and Mask Co-Optimization Method", which is hereby incorporated by reference in its entirety.

Another source and patterning device optimization method and system that involves optimizing the source by adjusting pixels of the source is described in a commonly assigned U.S. patent application Ser. No. 12/813,456, filed on Jun. 10, 2010, and published as U.S. Patent Application Publication No. 2010/0315614, titled "Source-Mask Optimization in Lithography apparatus", which is hereby incorporated by reference in its entirety.

Although specific reference may be made in this text to the use of the embodiments in the manufacture of ICs, it should be explicitly understood that the embodiments has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "wafer" or "die" in this text should be considered as interchangeable with the more general terms "substrate" and "target portion," respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm).

The term "optimizing" and "optimization" as used herein mean adjusting a lithography apparatus such that results and/or processes of lithography have more desirable characteristics, such as higher accuracy of projection of design layouts on a substrate, larger process windows, etc.

Further, the lithography apparatus may be of a type having two or more substrate tables (and/or two or more patterning device tables). In such "multiple stage" devices the additional tables may be used in parallel, or preparatory steps may be carried out on one or more tables while one or more other tables are being used for exposures. Twin stage lithography apparatuses are described, for example, in U.S. Pat. No. 5,969,441, incorporated herein by reference.

The patterning device referred to above represents design layouts. The design layouts can be generated utilizing CAD (computer-aided design) programs, this process often being referred to as EDA (electronic design automation). Most CAD programs follow a set of design rules in order to create functional design layouts/patterning devices. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit. One of the goals in integrated circuit fabrication is to faithfully reproduce the original circuit design on the substrate (via the patterning device).

The term patterning device as employed in this text may be broadly interpreted as referring to generic patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include:

- a programmable mirror array. An example of such a device is a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The matrix addressing can be performed using suitable electronics. More information on such mirror arrays can be gleaned, for example, from U.S. Pat. Nos. 5,296,891 and 5,523,193, which are incorporated herein by reference.
- a programmable LCD array. An example of such a construction is given in U.S. Pat. No. 5,229,872, which is incorporated herein by reference.

Figure 1B:
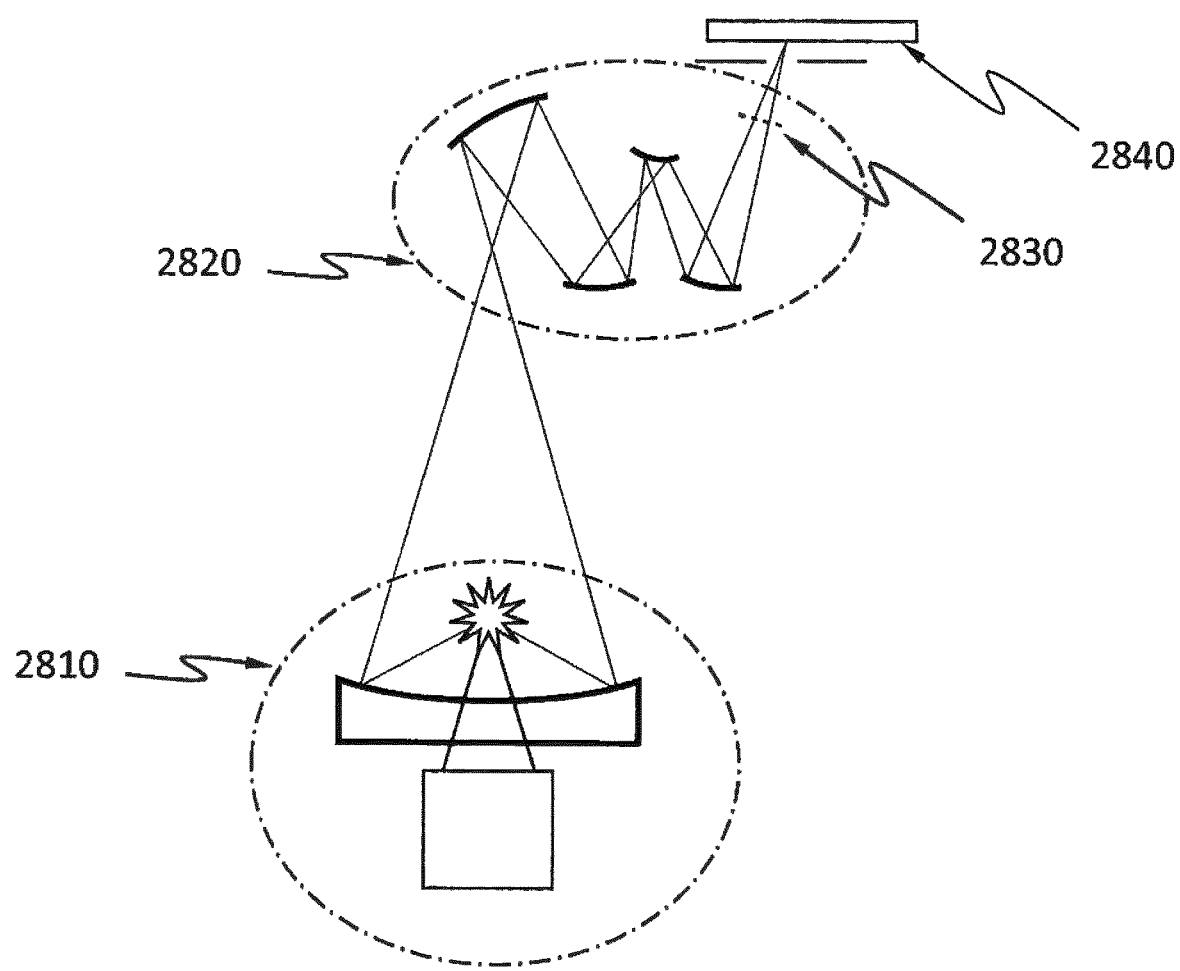
FIG. 1B shows a schematic of an illumination source.

As a brief introduction, FIG. 1A illustrates a lithography apparatus. Major components are an illumination source 12, which may be a deep-ultraviolet excimer laser source or other type of sources including extreme ultra violet (EUV) sources, illumination optics which define the partial coherence (denoted as sigma) and which may include optics 14, 16a and 16b that shape radiation from the source 12; a patterning device (e.g., a mask or reticle) 18; and transmission optics 16c that project an image of the patterning device pattern onto a substrate plane 22. An adjustable filter or aperture 20 at the pupil plane of the projection optics may restrict the range of beam angles that impinge on the substrate plane 22, where the largest possible angle defines the numerical aperture of the projection optics NA=sin($\Theta_{max}$). The term "source" and "illumination source" as used herein may include illumination optics. For example, FIG. 1B shows an EUV illumination source including a source collector module 2810 and illumination optics 2820. In the source collector module 2810, EUV radiation may be produced by a plasma. The EUV radiation is then shaped by the illumination optics 2820 and directed to a patterning device 2840. A pupil at a plane between the patterning device 2840 and the illumination optics 2820 may be referred to as an illumination pupil. The "shape" of the illumination source refers to the intensity and/or phase distribution at the illumination pupil.

In an optimization process of a system, a figure of merit of the system can be represented as a cost function. The optimization process boils down to a process of finding a set of parameters (design variables) of the system that minimizes the cost function. The cost function can have any suitable form depending on the goal of the optimization. For example, the cost function can be weighted root mean square (RMS) of deviations of certain characteristics (evaluation points) of the system with respect to the intended values (e.g., ideal values) of these characteristics; the cost function can also be the maximum of these deviations. The term "evaluation points" herein should be interpreted broadly to include any characteristics of the system. The design variables of the system can be confined to finite ranges and/or be interdependent due to practicalities of implementations of the system. In case of a lithography apparatus, the constraints are often associated with physical properties and characteristics of the hardware such as tunable ranges, and/or patterning device manufacturability design rules, and the evaluation points can include physical points on a resist image on a substrate, as well as non-physical characteristics such as dose and focus.

In a lithography apparatus, a source provides illumination (i.e. radiation); projection optics direct and shapes the illumination via a patterning device and onto a substrate. The term "projection optics" is broadly defined here to include any optical component that may alter the wavefront of the radiation beam. For example, projection optics may include at least some of the components 14, 16a, 16b and 16c. An aerial image (AI) is the radiation intensity distribution on the substrate. A resist layer on the substrate is exposed and the aerial image is transferred to the resist layer as a latent "resist image" (RI) therein. The resist image (RI) can be defined as a spatial distribution of solubility of the resist in the resist layer. A resist model can be used to calculate the resist image from the aerial image, an example of which can be found in commonly assigned U.S. patent application Ser. No. 12/315,849, disclosure of which is hereby incorporated by reference in its entirety. The resist model is related only to properties of the resist layer (e.g., effects of chemical processes which occur during exposure, PEB and development). Optical properties of the lithography apparatus (e.g., properties of the source, the patterning device and the projection optics) dictate the aerial image. Since the patterning device used in the lithography apparatus can be changed, it is desirable to separate the optical properties of the patterning device from the optical properties of the rest of the lithography apparatus including at least the source and the projection optics.

Figure 1C:
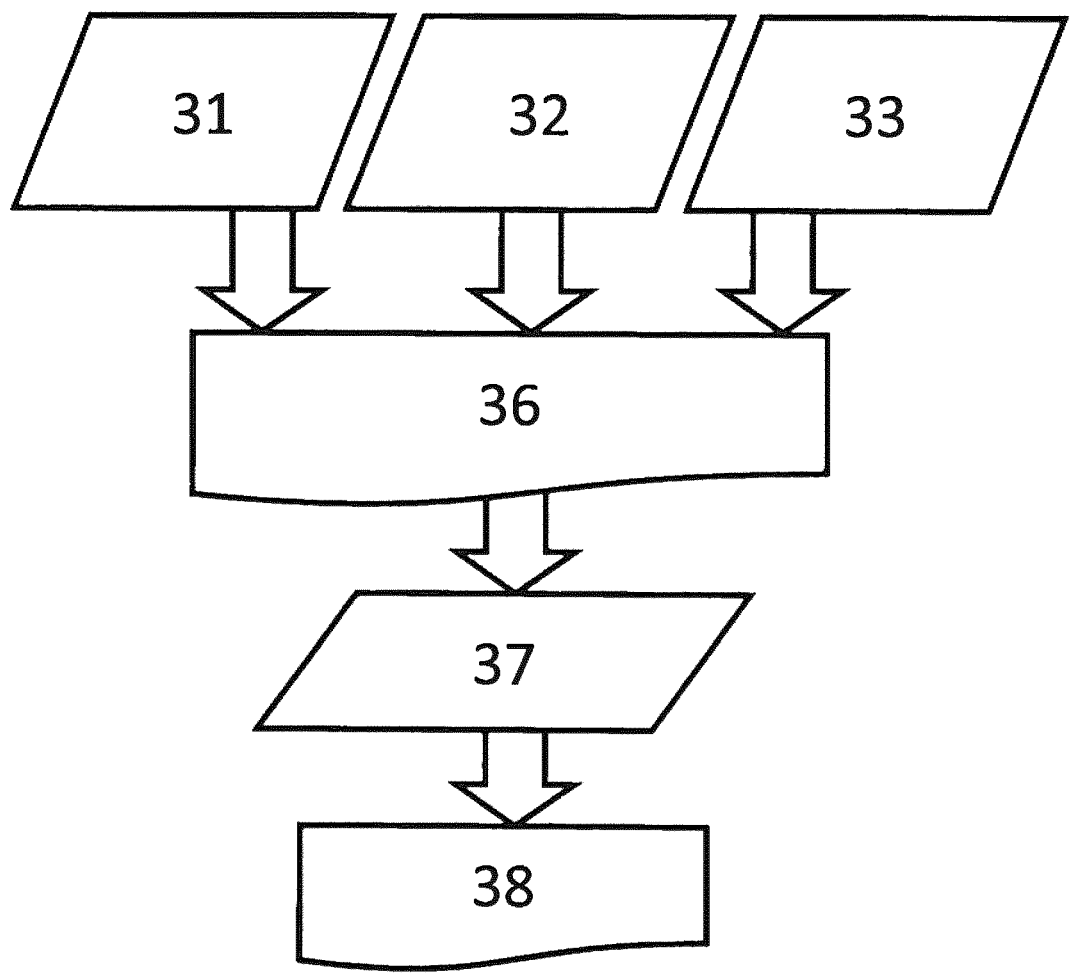
FIG. 1C is a block diagram of simulation models corresponding to the subsystems in FIG. 1A.

A flow chart for simulating lithography in a lithography apparatus is illustrated in FIG. 1C. A source model 31 represents optical characteristics (including radiation intensity distribution and/or phase distribution) of the source. A projection optics model 32 represents optical characteristics (including changes to the radiation intensity distribution and/or the phase distribution caused by the projection optics) of the projection optics. The projection optics model 32 may include aberration caused by various factors, for example, heating of the components of the projection optics, stress caused by mechanical connections of the components of the projection optics. The source model 31 and the projection optics model 32 can be combined into a transmission cross coefficient (TCC) model. A design layout model 33 represents optical characteristics (including changes to the radiation intensity distribution and/or the phase distribution caused by a given design layout) of a design layout, which is the representation of an arrangement of features of a patterning device. An aerial image 36 can be simulated from the source model 31, the projection optics model 32 and the design layout model 33. A resist image 38 can be simulated from the aerial image 36 using a resist model 37. Simulation of lithography can, for example, predict contours and CDs in the resist image.

More specifically, it is noted that the source model 31 can represent the optical characteristics of the source that include, but not limited to, NA-sigma ($\sigma$) settings as well as any particular illumination source shape (e.g. off-axis radiation sources such as annular, quadrupole, and dipole, etc.). The projection optics model 32 can represent the optical characteristics of the of the projection optics that include aberration, distortion, refractive indexes, physical sizes, physical dimensions, absorption, etc. The design layout model 33 can also represent physical properties of a physical patterning device, as described, for example, in U.S. Pat. No. 7,587,704, which is incorporated by reference in its entirety. The objective of the simulation is to accurately predict, for example, edge placements and CDs, which can then be compared against an intended design. The intended design is generally defined as a pre-OPC design layout which can be provided in a standardized digital file format such as GDSII or OASIS or other file format.

From this design layout, one or more portions may be identified, which are referred to as "clips." In a specific embodiment, a set of clips is extracted, which represents the complicated patterns in the design layout (typically about 50 to 1000 clips, although any number of clips may be used). As will be appreciated by those skilled in the art, these patterns or clips represent small portions (i.e. circuits, cells or patterns) of the design and especially the clips represent small portions for which particular attention and/or verification is needed. In other words, clips may be the portions of the design layout or may be similar or have a similar behavior of portions of the design layout where critical features are identified either by experience (including clips provided by a customer), by trial and error, or by running a full-chip simulation. Clips usually contain one or more test patterns or gauge patterns.

An initial larger set of clips may be provided a priori by a customer based on known critical feature areas in a design layout which require particular image optimization. Alternatively, in another embodiment, the initial larger set of clips may be extracted from the entire design layout by using some kind of automated (such as, machine vision) or manual algorithm that identifies the critical feature areas.

Examples of optimization methods can be found, for example, in U.S. patent application Ser. No. 12/914,946 filed Oct. 28, 2010, the disclosure of which is hereby incorporated by reference in its entirety.

RET, OPC or optimization may benefit from knowing the relationship between the design layout and its representation on the patterning device, or knowing the relationship between the representation of the design layout on the patterning device and the image formed on the substrate by projecting the representation. For example, a change in the reduction ratio M probably will lead to a change in the result of RET, OPC or optimization.

One metric that characterizes the relationship between the image formed on the substrate and the representation of the design layout on the patterning device is called the Mask Error Enhancement Factor (MEEF). MEEF can be mathematically expressed as $$MEEF = \frac{\partial CD_s}{\partial (CD_p / M)}$$

e M is the reduction ratio, $CD_p$ a CD on the patterning device, $CD_s$ the image of the $CD_p$ projected onto the substrate. An isotropic (i.e., being independent of directions) reduction ratio M certainly keeps MEEF simple. However, in some situations, the reduction ratio M may be anisotropic. For example, when the patterning device is reflective and the NA is large, as illustrated in FIG. 2A and FIG. 2B.

Figure 2A:
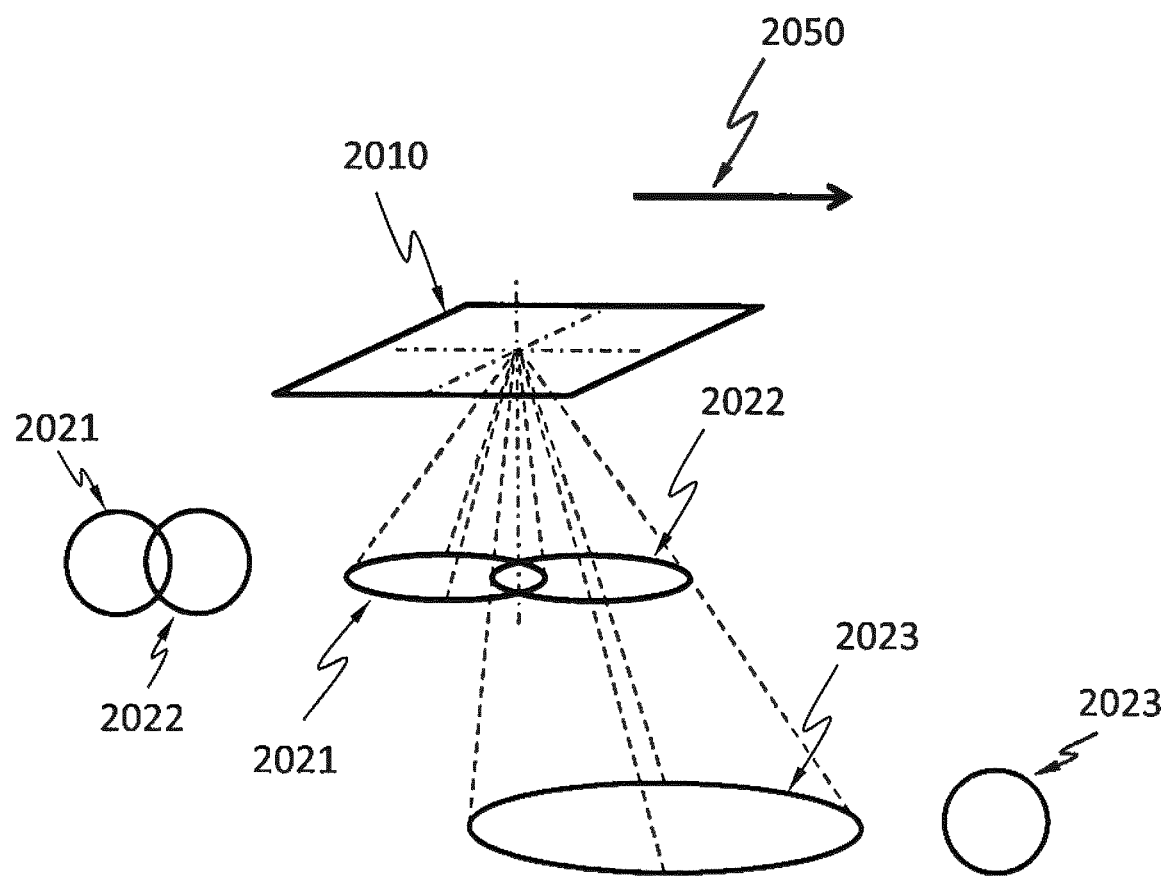
FIG. 2A shows that incoming light from the source toward a reflective patterning device and outgoing light may spatially overlap.

FIG. 2A shows that incoming light 2021 from the source toward a reflective patterning device 2010 and outgoing light 2022 (i.e., scattered light from the incoming light 2021 by the patterning device 2010) may spatially overlap. The overlap may occur when the NA is too large for a given chief ray angle. The overlap may cause interference that adversely affects the image 2023 formed on a substrate from the patterning device 2011. For example, the interference may cause the image 2023 to deviate from the design layout. Arrow 2050 is the scanning direction when the patterning device is mounted in a lithography apparatus.

Figure 2B:
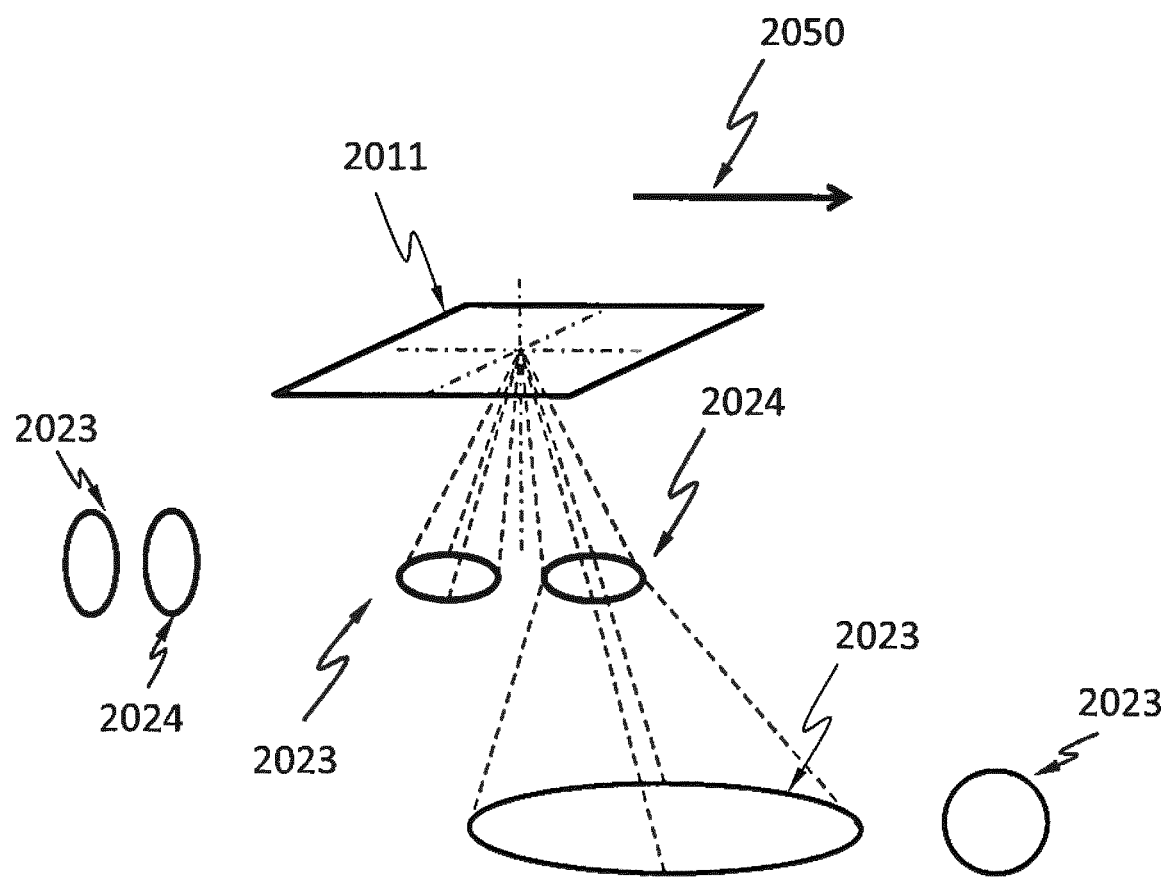
FIG. 2B shows that by making the reduction ratio anisotropic, the overlap between the incoming light and the outgoing light may be avoided.

FIG. 2B shows that by making the reduction ratio anisotropic, the overlap between the incoming light and the outgoing light may be avoided. For example, the spatial extent of the incoming light 2023 and the outgoing light 2024 may be spatially compressed in the scanning direction; the representation of the design layout by the patterning device 2011 is also spatially compressed in the scanning direction. However, the image 2023 of the design layout formed from the compressed representation by the patterning device 2011 should not be compressed. Therefore, the projection optics are anamorphic so as to "uncompress" the outgoing light 2024 in the scanning direction relative to a direction perpendicular to the scanning direction. For example, the reduction ratio may be 8 in the scanning direction but be 4 in the direction perpendicular to the scanning direction.

Figure 3:
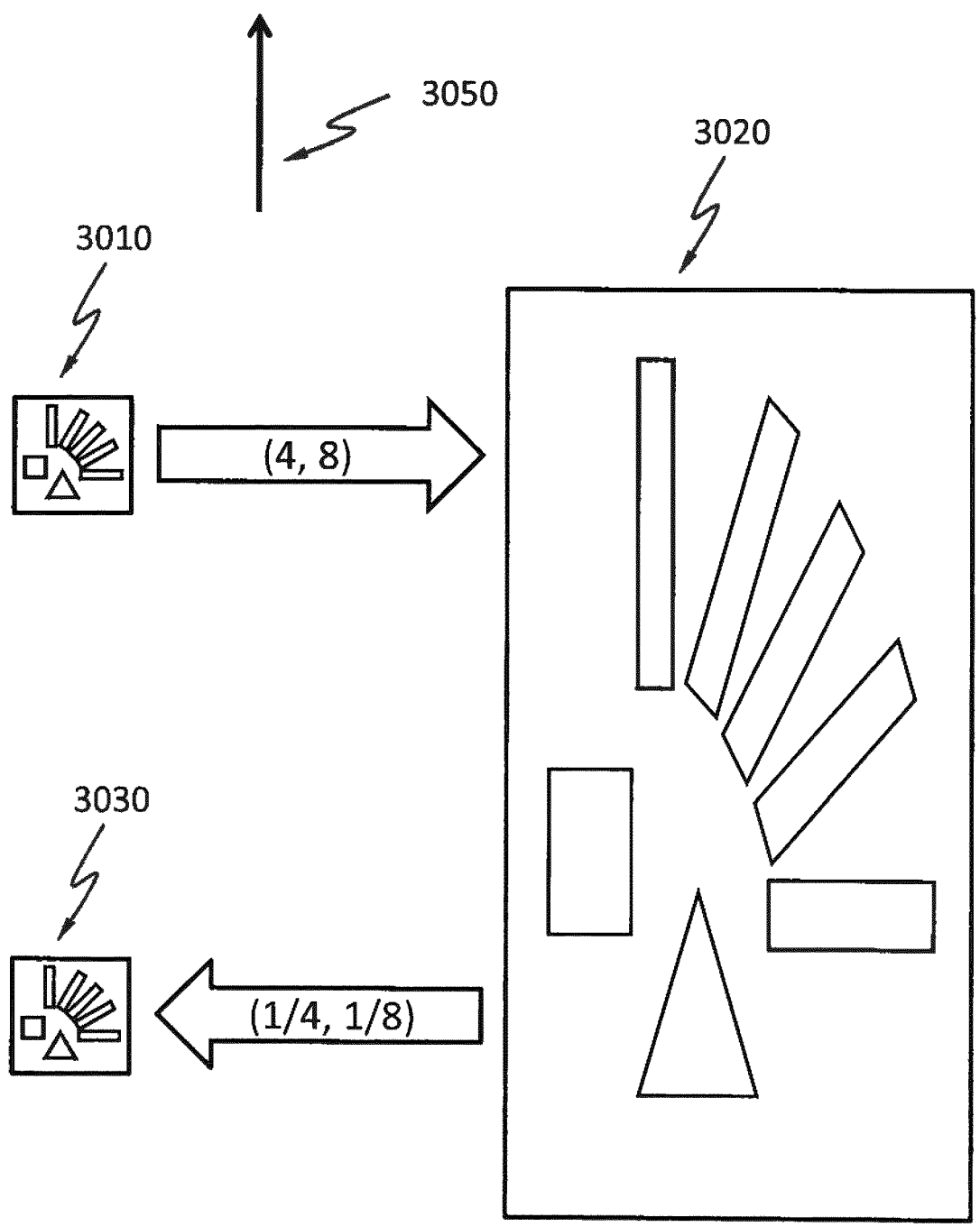
FIG. 3 schematically shows a design layout that includes features of various orientations.

FIG. 3 schematically shows a design layout 3010 that includes features of various orientations. When the reduction ratio is anisotropic (e.g., 8 in the scanning direction and 4 in the direction perpendicular to the scanning direction), the representation 3020 of the design layout 3010 by a patterning device thus is spatially scaled by a factor of 8 in the scanning direction and spatially scaled by a factor of 4 in the direction perpendicular to the scanning direction, relative to the design layout 3010. When the representation 3020 of the design layout 3010 is projected onto a substrate to form an image 3030, the projection optics spatially scale the image 3030 relative to the representation 3020, by a factor of ⅛ in the scanning direction and by a factor of ¼ in the direction perpendicular to the scanning direction. Because of the anisotropicity of the reduction ratio, both the shapes and the sizes of the features of the representation 3020 are different from the corresponding features of the design layout 3010. The change of shapes pose a particular difficulty to a procedure that involves the physical shape and orientation of features represented on a patterning device, or involves a physical interaction with the features represented on the patterning device. Examples of such a procedure may include simulating, measuring, characterizing, optimizing or adjusting the patterning device or a physical interaction with the patterning device. As an example, when determining the 3D effect of features represented on a patterning device, the actual shapes and orientations of these feature should be considered, not merely the shapes and orientations of the corresponding features on the design layout. As an example, when assist features are placed into the representation or existing assist features of the representation are adjusted, the actual shapes and orientations of these feature should be considered, not merely the shapes and orientations of the corresponding features on the design layout. Another example is characterization of the quality of the patterning device, such as measuring the locations, shapes and sizes of the features of the representation. Simulation of images on the substrate also relies on the actual shapes and orientations of feature of the representation because simulation is based on modeling the interaction of light and the actual features.

Figure 4A:
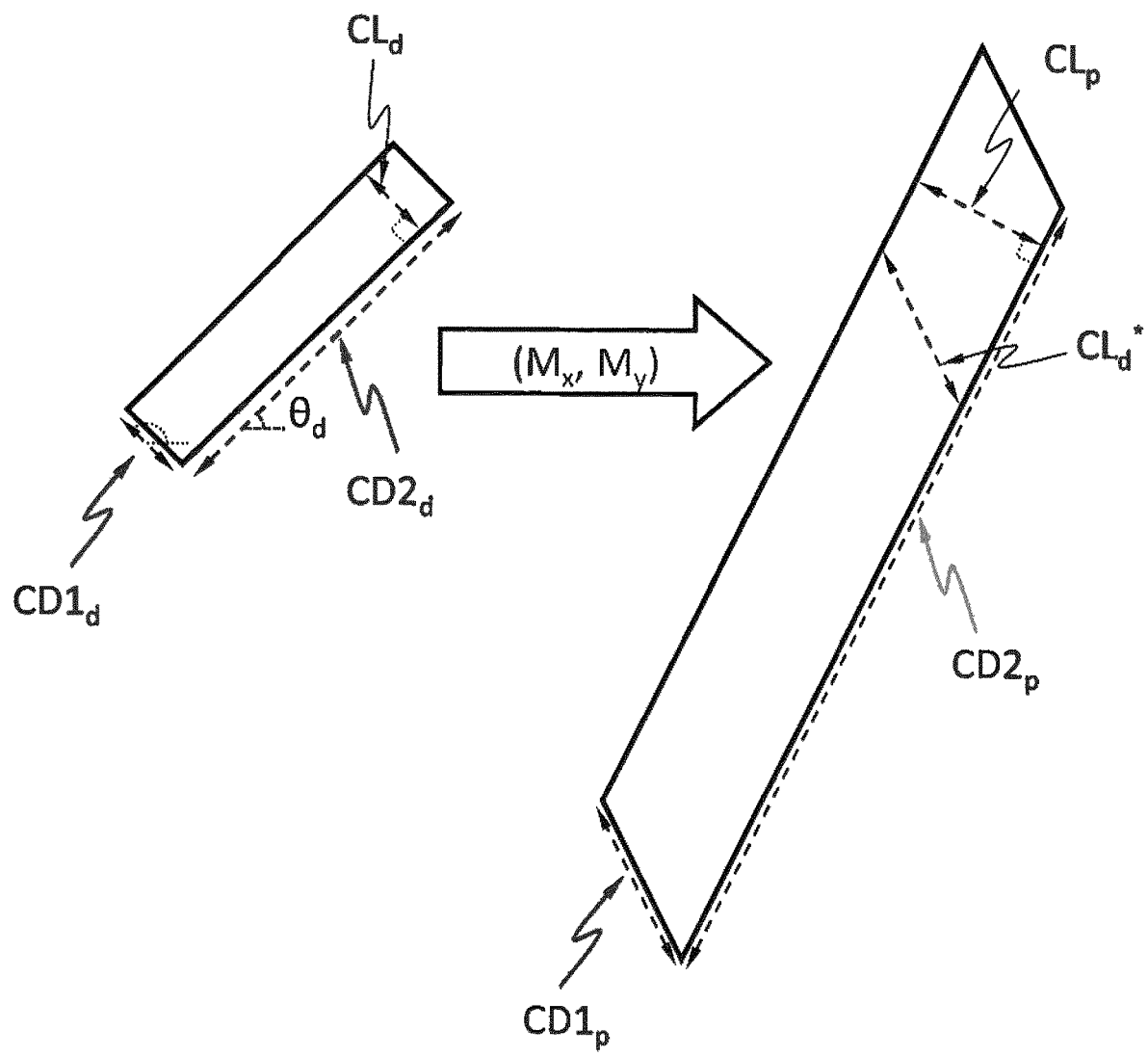
FIG. 4A shows the mapping of CDs and cutline lengths between the design layout and the representation of the design layout on a patterning device with a reduction ratio of $M_x$ in one direction ("x direction") and $M_y$ in another direction ("y direction") which can be perpendicular to the x direction.

FIG. 4A shows the mapping of CDs and cutline lengths between the design layout and the representation of the design layout on a patterning device with a reduction ratio of $M_x$ in one direction ("x direction") and $M_y$ in another direction ("y direction") perpendicular to the x direction. Angle $\theta_d$ is the angle of a CD or cutline in the design layout with respect to the x direction. In either the design layout or the representation of the design layout on the patterning device, a cutline is always perpendicular to and between two parallel edges, and a CD is always parallel to an edge. Therefore, a cutline such as $CL_d$ in the design layout does not always correspond to a cutline such as $CL_p$ in the representation of the design layout. In this example shown in FIG. 4A, the cutline $CL_d$ corresponds to the line marked as $CL_d^*$, which is not perpendicular to the edges in the representation and thus not a cutline. A ratio of a cutline length $CL_p$ in the representation over a cutline length $CL_d$ in the design layout can be calculated as follows:

$$M_{CL}(\theta_d) = \frac{CL_p}{CL_d} = \frac{\frac{M_x M_y \tan\theta_d}{\sqrt{M_x^2 + M_y^2 \tan^2\theta_d}}}{\frac{\tan\theta_d}{\sqrt{1+\tan^2\theta_d}}}$$

($\theta_d$ in the formula above for $M_{CL}(\theta_d)$ is the $\theta_d$ of the edges the cutline is perpendicular to ($CD2_d$ in this example)) and a ratio of a $CD_p$ (e.g., $CD1_p$ or $CD2_p$) in the representation of the design layout to a corresponding $CD_d$ (e.g., $CD1_d$ or $CD2_d$) in the design layout can be calculated as follows:

$$M_{CD}(\theta_d) = \frac{CD_p}{CD_d} = \frac{\sqrt{M_x^2 + M_y^2 \tan^2\theta_d}}{\sqrt{1+\tan^2\theta_d}} =$$

$$M_x \sqrt{\frac{1 + \left(\frac{M_y}{M_x}\right)^2 \tan^2\theta_d}{1+\tan^2\theta_d}} = M_x \sqrt{\cos^2\theta_d + \left(\frac{M_y}{M_x}\right)^2 \sin^2\theta_d}$$

Figure 4B:
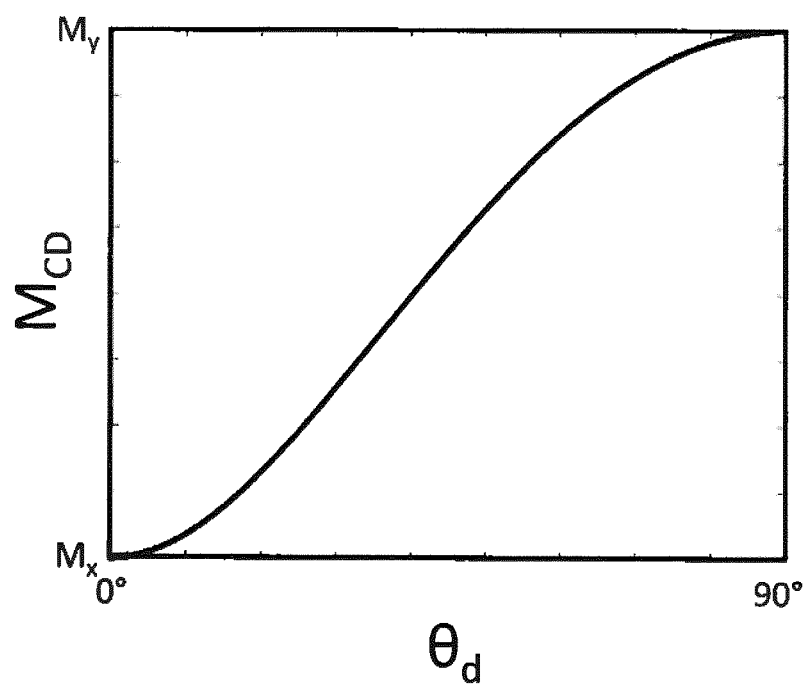
FIG. 4B shows the ratio $M_{CD}$ as a function of $\theta_d$.
Figure 4C:
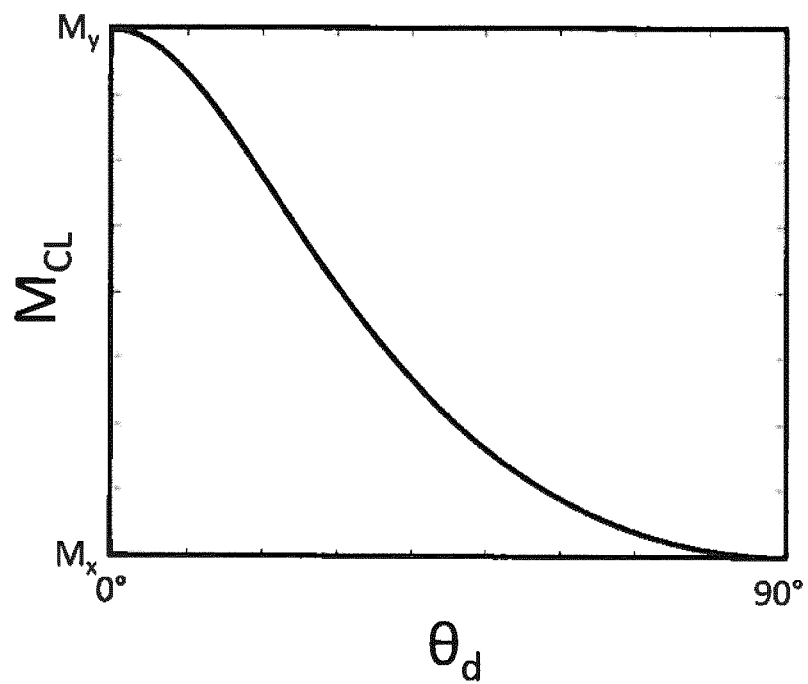
FIG. 4C shows the ratio $M_{CL}$ as a function of $\theta_d$.

FIG. 4B shows the ratio $M_{CD}$ as a function of $\theta_d$. FIG. 4C shows the ratio $M_{CL}$ as a function of $\theta_d$.

Figure 5A:
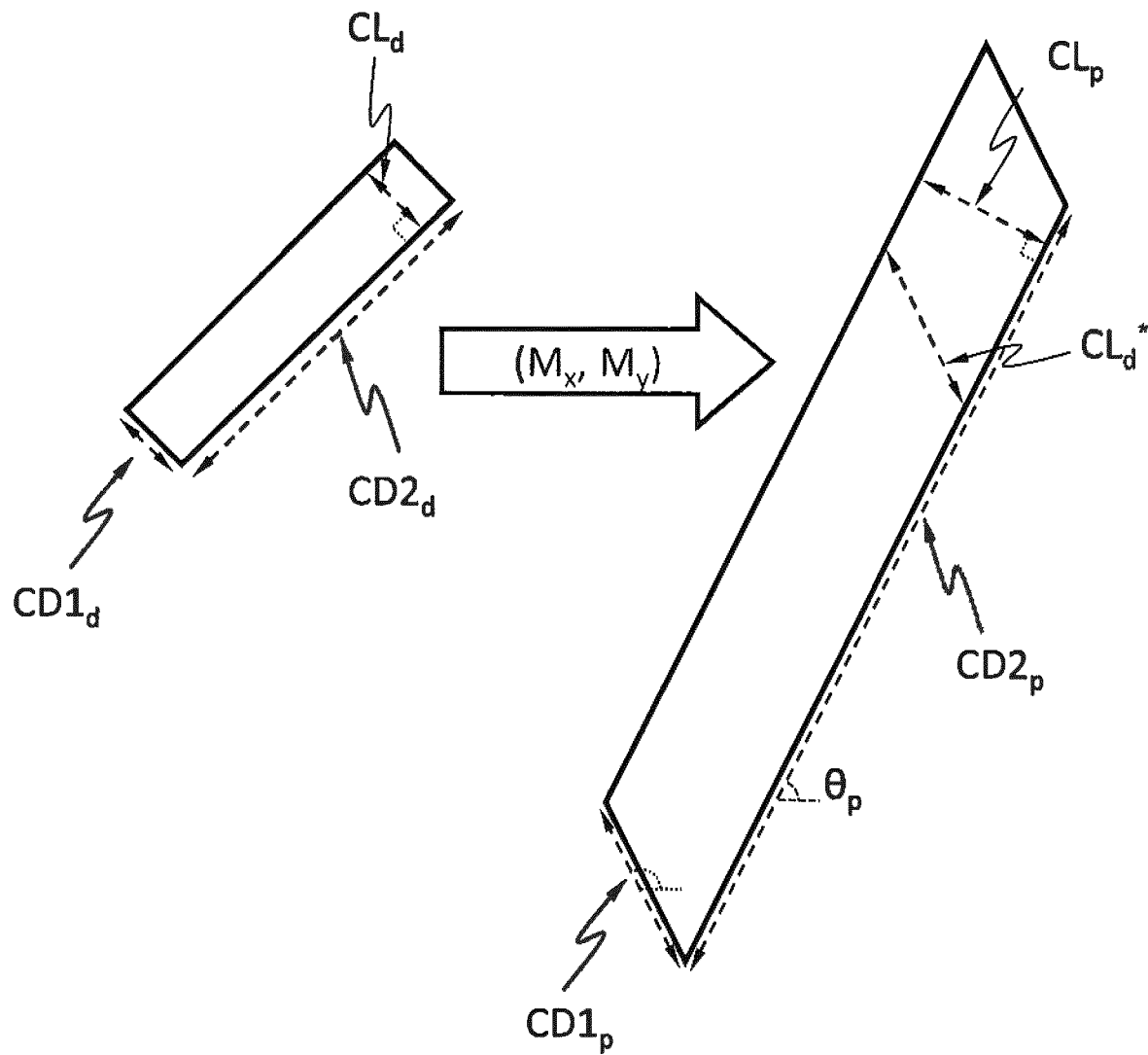
FIG. 5A shows the mapping of CDs and cutline lengths between the design layout and the representation of the design layout on a patterning device with a reduction ratio of $M_x$ in one direction ("x direction") and $M_y$ in another direction ("y direction") which can be perpendicular to the x direction.

FIG. 5A shows the mapping of CDs and cutline lengths between the design layout and the representation of the design layout on a patterning device with a reduction ratio of $M_x$ in one direction ("x direction") and $M_y$ in another direction ("y direction") perpendicular to the x direction. Angle $\theta_p$ is the angle of a CD or cutline in the representation of the design layout with respect to the x direction. In either the design layout or the representation of the design layout on the patterning device, a cutline is always perpendicular to and between two parallel edges, and a CD is always parallel to an edge. Therefore, a cutline such as $CL_d$ in the design layout does not always correspond to a cutline such as $CL_p$ in the representation of the design layout. In this example shown in FIG. 5A, the cutline $CL_d$ corresponds to the line marked as $CL_d^*$, which is not perpendicular to the edges in the representation and thus not a cutline. A ratio of a cutline length $CL_p$ in the representation over a cutline length $CL_d$ in the design layout can be calculated as follows:

$$M_{CL}(\theta_p) =$$

$$\frac{CL_p}{CL_d} = \frac{\frac{\tan\theta_p}{\sqrt{1+\tan^2\theta_p}}}{\frac{1}{M_x}\frac{1}{M_y}\tan\theta_p} = M_x M_y \sqrt{\frac{\left(\frac{1}{M_x}\right)^2 + \left(\frac{\tan\theta_p}{M_y}\right)^2}{1+\tan^2\theta_p}} =$$

$$\sqrt{\left(\frac{1}{M_x}\right)^2 + \left(\frac{\tan\theta_p}{M_y}\right)^2}$$

$$M_y \sqrt{\frac{1 + \left(\frac{M_x}{M_y}\right)^2 \tan^2\theta_p}{1+\tan^2\theta_p}} = M_y \sqrt{\cos^2\theta_p + \left(\frac{M_x}{M_y}\right)^2 \sin^2\theta_p}$$

($\theta_p$ in the formula above for $M_{CL}(\theta_p)$ is the $\theta_p$ of the edges the cutline is perpendicular to ($CD2_p$ in this example)) and a ratio of a $CD_p$ (e.g., $CD1_p$ or $CD2_p$) in the representation of the design layout to a corresponding $CD_d$ (e.g., $CD1_d$ or $CD2_d$) in the design layout can be calculated as follows:

$$M_{CD}(\theta_p) = \frac{CD_p}{CD_d} = \frac{\sqrt{1+\tan^2\theta_p}}{\sqrt{\left(\frac{1}{M_x}\right)^2 + \left(\frac{\tan\theta_p}{M_y}\right)^2}} =$$

$$M_x \sqrt{\frac{1+\tan^2\theta_p}{1 + \left(\frac{M_x}{M_y}\right)^2 \tan^2\theta_p}} = \frac{M_x}{\sqrt{\cos^2\theta_p + \left(\frac{M_x}{M_y}\right)^2 \sin^2\theta_p}}$$

Figure 5B:
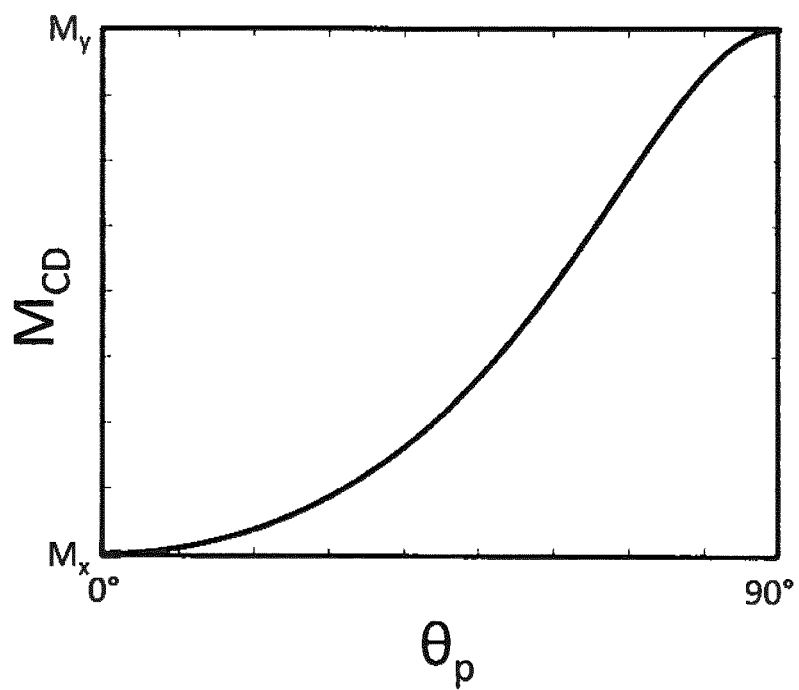
FIG. 5B shows the ratio $M_{CD}$ as a function of $\theta_p$.
Figure 5C:
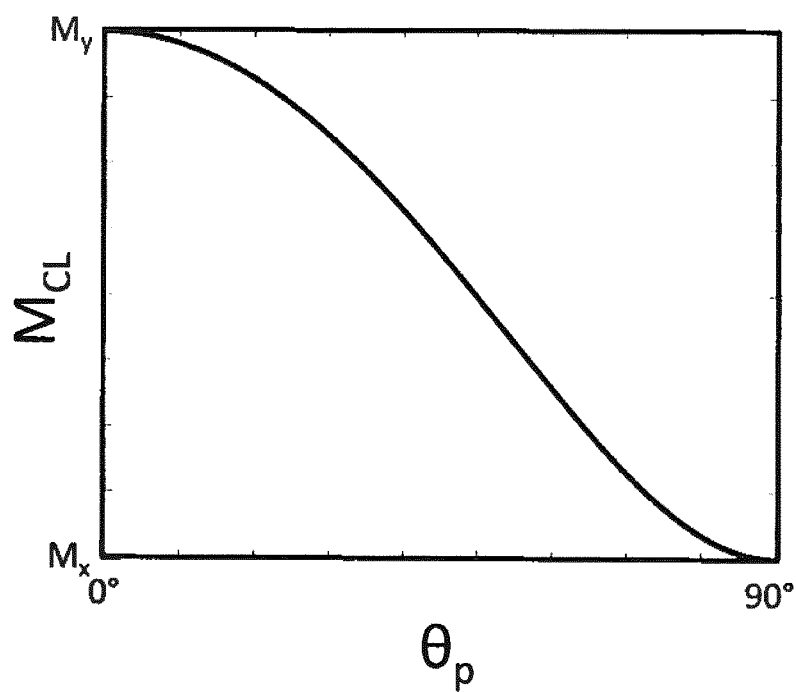
FIG. 5C shows the ratio $M_{CL}$ as a function of $\theta_p$.

FIG. 5B shows the ratio $M_{CD}$ as a function of $\theta_p$. FIG. 5C shows the ratio $M_{CL}$ as a function of $\theta_p$. The difference between FIG. 5B and FIG. 4B is that $M_{CD}$ is expressed as a function of different angles: $\theta_p$ and $\theta_d$, respectively. The difference between FIG. 5C and FIG. 4C is that $M_{CL}$ is expressed as a function of different angles: $\theta_p$ and $\theta_d$, respectively.

When the reduction ratio is anisotropic, the MEEF may be extended to a tensor form such as $$MEEF = \begin{bmatrix} \frac{\partial CD1_d}{\partial CD1_p/M_{CD}} & \frac{\partial CD1_d}{\partial CD2_p/M_{CD}} \\ \frac{\partial CD2_d}{\partial CD1_p/M_{CD}} & \frac{\partial CD2_d}{\partial CD2_p/M_{CD}} \end{bmatrix}$$

because a change in CD in the image may depend not only on a change in a correspond CD in the representation of the design layout, but also another CD in the representation.

Figure 6A:
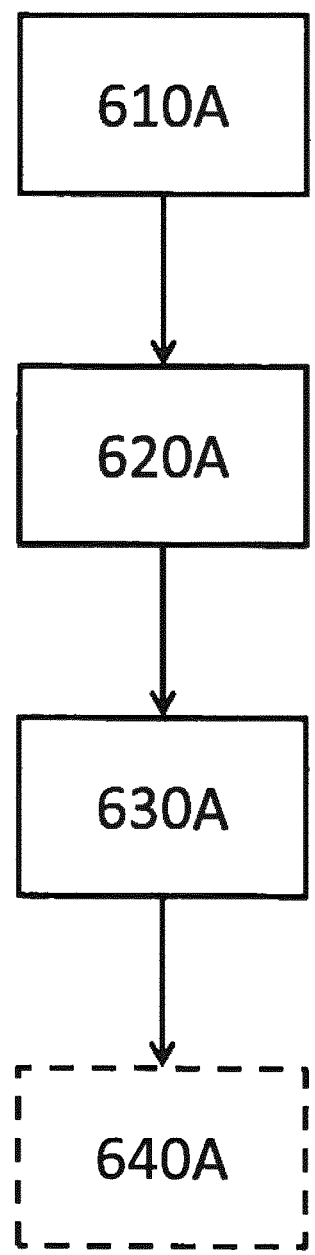
FIG. 6A-FIG. 6D each show a flow chart for a method, according to an embodiment.

FIG. 6A shows a flow chart for a method. In procedure 610A, obtain at least a clip of a design layout. In procedure 620A, determine a representation of the clip on a patterning device, under the condition that the reduction ratio is anisotropic. In procedure 630A, make or configure the patterning device based on the representation. In optional procedure 640A, measure the patterning device so made or configured. The patterning device may be a reflective patterning device. The patterning device may be a transmissive patterning device. The patterning device may be programmable. Measuring the patterning device may include measuring a cutline length on a feature in the representation. Measuring the patterning device may include measuring a CD on a feature in the representation. Measuring the patterning device may include measuring an angle on a feature in the representation.

Figure 6B:
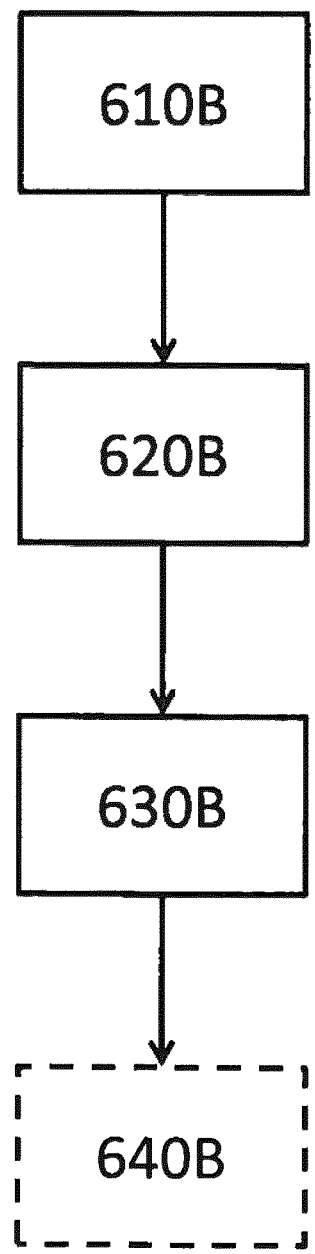

FIG. 6B shows a flow chart for a method. In procedure 610B, obtain at least a clip of a design layout. In procedure 620B, determine a representation of the clip on a patterning device, under the condition that the reduction ratio is anisotropic. In procedure 630B, simulate an image formed on a substrate by projecting the representation onto the substrate. In optional procedure 640B, adjust a lithography apparatus or a lithography process based on the simulated image. The patterning device may be a reflective patterning device. The patterning device may be a transmissive patterning device. The patterning device may be programmable. The image may be a resist image, an aerial image, or an etched image. Simulating the image may include modeling a source or projection optics of a lithography apparatus, or modeling interaction of light from the source with features in the representation. Adjusting the lithography apparatus may include adjusting the source or projection optics of the lithography apparatus. Adjusting the lithography process may include adjusting focus, dose, scan speed, development, PEB, etching, or a combination thereof.

Figure 6C:
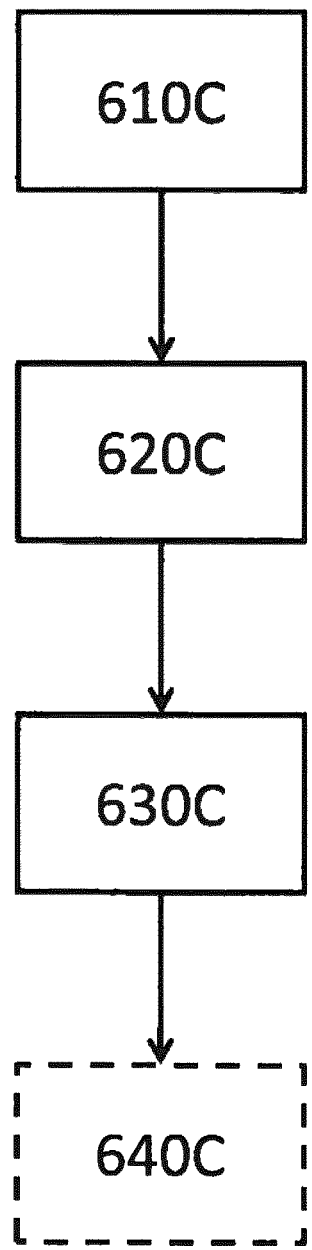

FIG. 6C shows a flow chart for a method. In procedure 610C, obtain at least a clip of a design layout. In procedure 620C, determine a representation of the clip on a patterning device, under the condition that the reduction ratio is anisotropic. In procedure 630C, determine an interaction of light with the patterning device based on the representation. In optional procedure 640B, adjust a lithography apparatus or a lithography process based on the interaction. The patterning device may be a reflective patterning device. The patterning device may be a transmissive patterning device. The patterning device may be programmable. The interaction may be scattering due to the finite height of the features in the representation (3D effect). The interaction may be absorption of the light by features in the representation.

Figure 6D:
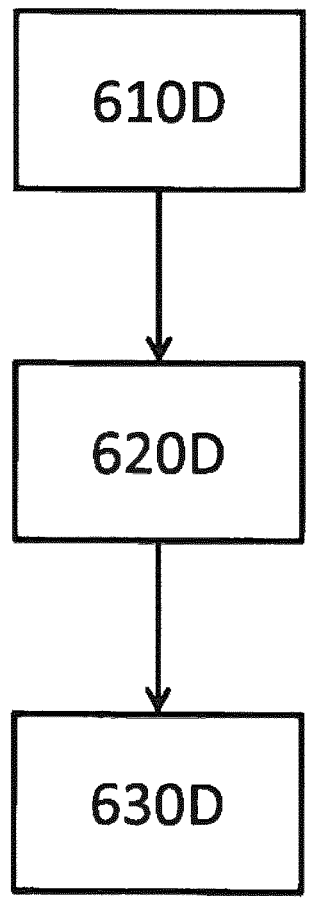

FIG. 6D shows a flow chart for a method. In procedure 610D, obtain at least a clip of a design layout. In procedure 620D, determine a representation of the clip on a patterning device, under the condition that the reduction ratio is anisotropic. In procedure 630D, adjust a lithography apparatus or a lithography process based on the representation. The patterning device may be a reflective patterning device. The patterning device may be a transmissive patterning device. The patterning device may be programmable. Adjusting the lithography apparatus may include adjusting the source or projection optics of the lithography apparatus. Adjusting the lithography process may include adjusting focus, dose, scan speed, development, PEB, etching, or a combination thereof.

Figure 7:
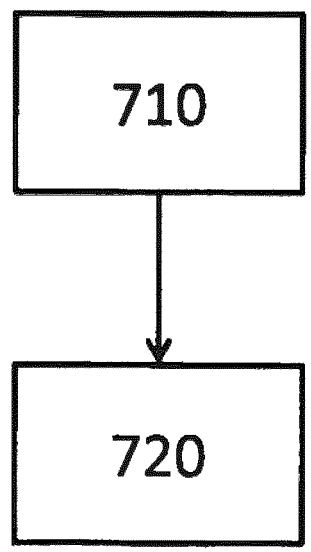
FIG. 7 shows a flow chart for a method, according to an embodiment.

FIG. 7 shows a flow chart for a method. In procedure 710, obtain a relationship between one or more first geometric characteristics in a design layout or an image thereof, and one or more second geometric characteristics in a representation of the design layout on a patterning device. The relationship may be a function of a reduction ratio, wherein the reduction ratio is a function of an angle the first geometric characteristic, or a function of an angle of the second geometric characteristic. The relationship may be a function of an orientation of the first geometric characteristic, or a function of an orientation of the second geometric characteristic. The relationship may be anisotropic. The first geometric characteristics may be a cutline length, a CD, or a change of CD. The second geometric characteristics may be a cutline length, a CD, or a change of CD. The value of the first geometric characteristics may be determined from the value of the second geometric characteristics, and vice versa, using the relationship. For example, the length of the cutline $CL_d$ may be determined from the length of the cutline $CL_p$ using $M_{CL}$. The value so determined by using the relationship can be used to adjust a lithography apparatus or a lithography process, such as to adjust a source or projection optics of the lithography apparatus, the design layout or its representation. The value so determined by using the relationship can be used to determine a location for measurement on the design or the image. The value so determined by using the relationship can be used to determine an interaction of light with the patterning device. For example, if a cutline cannot be drawn at a location because there is not a line perpendicular to both edges at that location, a different location can be selected.

Figure 8:
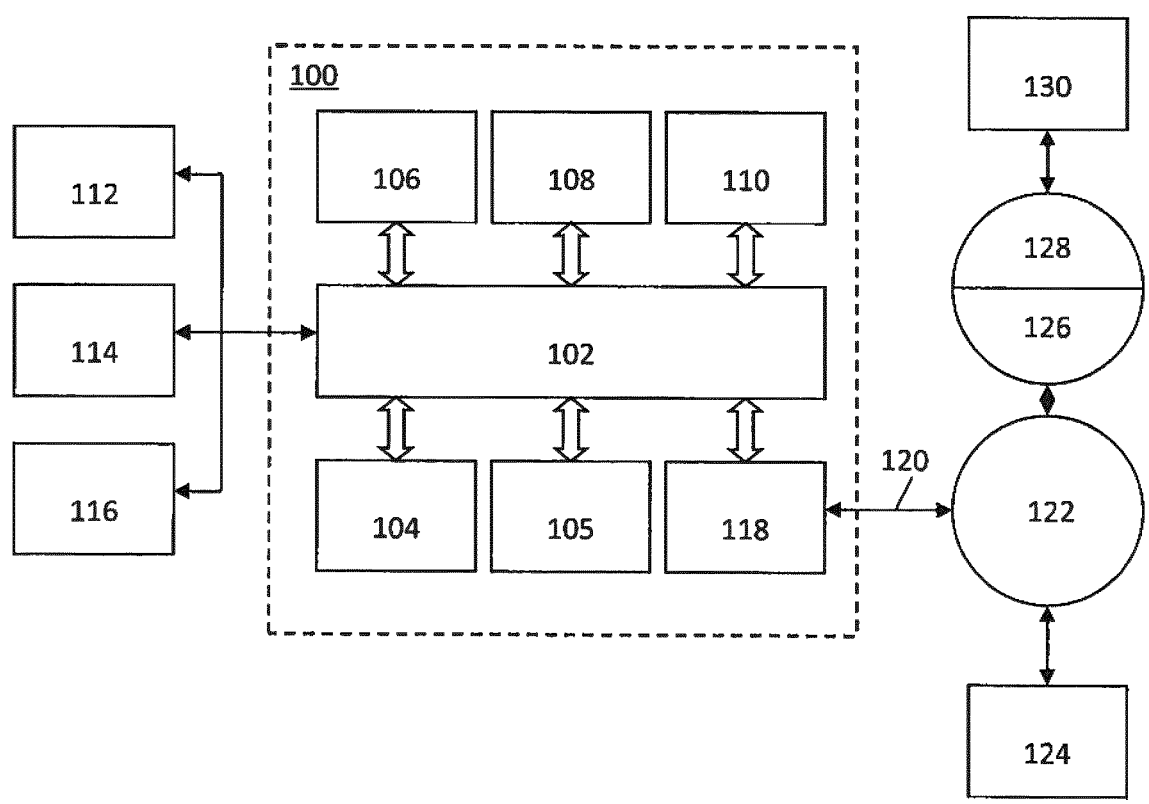
FIG. 8 is a block diagram of an example computer system in which embodiments can be implemented.

FIG. 8 is a block diagram that illustrates a computer system 100 which can assist in implementing the optimization methods and flows disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of the optimization process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In alternative embodiments, hard-wired circuitry may be used in place of or in combination with software instructions. Thus, embodiments are not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 may also include a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. In accordance with one or more embodiments, one such downloaded application provides for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Figure 9:
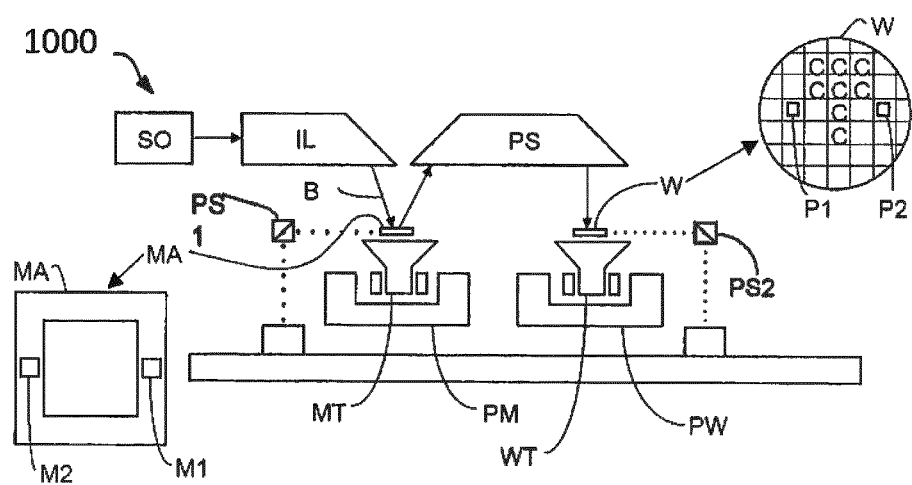
FIG. 9 is a schematic diagram of another lithography apparatus.

FIG. 9 schematically depicts another lithography apparatus 1000 whose illumination source could be optimized utilizing the methods described herein.

The lithography apparatus 1000 includes:
a source collector module SO
an illumination system (illuminator) IL configured to condition a radiation beam B (e.g. EUV radiation).
a support structure (e.g. a mask table) MT constructed to support a patterning device (e.g. a mask or a reticle) MA and connected to a first positioner PM configured to accurately position the patterning device;
a substrate table (e.g. a wafer table) WT constructed to hold a substrate (e.g. a resist coated wafer) W and connected to a second positioner PW configured to accurately position the substrate; and
a projection system (e.g. a reflective projection system) PS configured to project a pattern imparted to the radiation beam B by patterning device MA onto a target portion C (e.g. comprising one or more dies) of the substrate W.

As here depicted, the apparatus 1000 is of a reflective type (e.g. employing a reflective mask). It is to be noted that because most materials are absorptive within the EUV wavelength range, the mask may have multilayer reflectors comprising, for example, a multi-stack of Molybdenum and Silicon. In one example, the multi-stack reflector has a 40 layer pairs of Molybdenum and Silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Referring to FIG. 9, the illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 9, for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithography apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus 1000 could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 10:
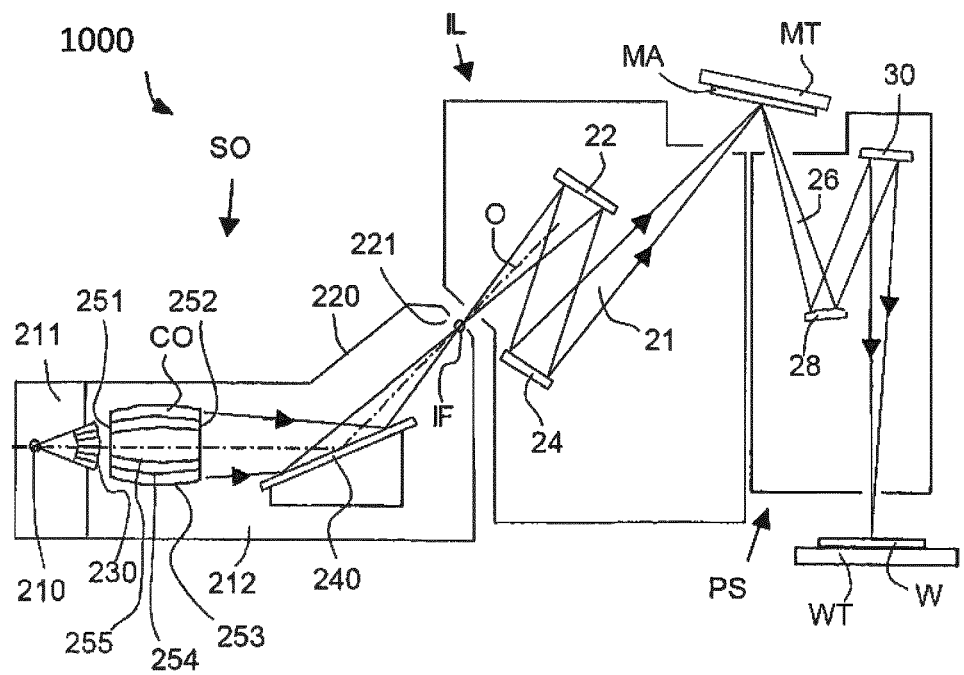
FIG. 10 is a more detailed view of the apparatus in FIG. 8.

FIG. 10 shows the apparatus 1000 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithography apparatus. Further, there may be more mirrors present than those shown in the figures, for example there may be 1-6 additional reflective elements present in the projection system PS than shown in FIG. 10.

Collector optic CO, as illustrated in FIG. 10, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type is preferably used in combination with a discharge produced plasma source, often called a DPP source.

Figure 11:
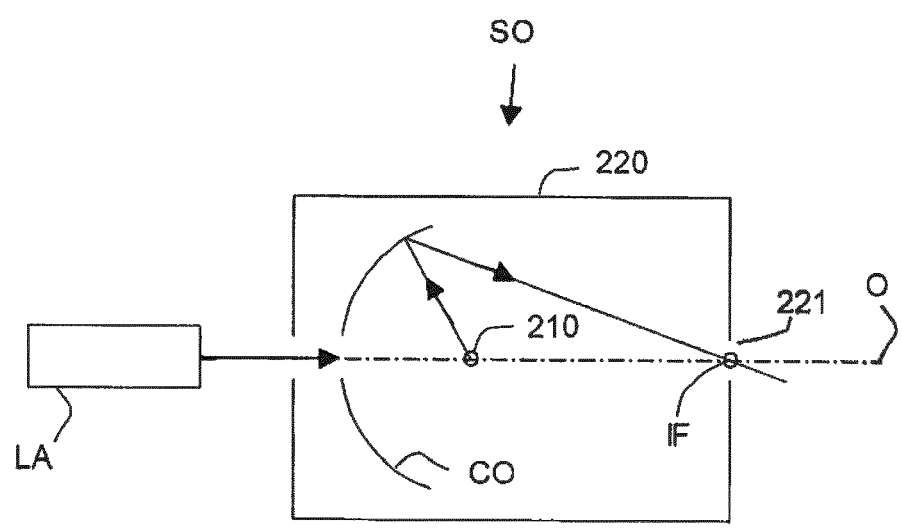
FIG. 11 is a more detailed view of the source collector module SO of the apparatus of FIG. 9 and FIG. 10.

Alternatively, the source collector module SO may be part of an LPP radiation system as shown in FIG. 11. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include EUV (extreme ultra violet) lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

According to an embodiment, a computer-implemented method to improve a lithography process for imaging a portion of a design layout onto a substrate using a lithography apparatus, comprises: obtaining one or more rules that determine one or more characteristics of one or more assist features based on one or more parameters selected from a group consisting of one or more characteristics of one or more design features in the portion, one or more characteristics of the lithography process, one or more characteristics of the lithography apparatus, and a combination thereof; optionally determining the one or more characteristics of the one or more assist features using the one or more rules; wherein the one or more parameters optionally comprise a spacing between a pair of edges, and wherein the one or more rules are configured to generate a predefined distance between the assist feature and one of the pair of edges for a range of space values between the pair of edges to obtain an asymmetric arrangement of the assist feature between the two edges; placing the one or more assist features onto the patterning device.

According to an embodiment, a computer-implemented method to improve a lithography process for imaging a portion of a design layout onto a substrate using a lithography apparatus, comprises: obtaining one or more rules applicable to a data structure representing the portion of the design layout, the one or more rules being configured to determine one or more characteristics of a further data structure representing one or more assist features based on one or more parameters selected from a group consisting of one or more characteristics of one or more design features in the portion, one or more characteristics of the lithography process, one or more characteristics of the lithography apparatus, and a combination thereof; determining the one or more characteristics of the further data structure representing the one or more assist features using the one or more rules; wherein the one or more parameters comprise a spacing between a pair of edges in the data structure representing the portion of the design layout, and wherein the one or more rules are configured to generate a predefined distance between the assist feature and one of the pair of edges for a range of space values between the pair of edges to obtain an asymmetric arrangement of the assist feature between the two edges; placing the further data structure representing the one or more assist features onto the data structure representing the portion of the design layout.

According to an embodiment, a computer-implemented method to improve a lithography process for imaging a portion of a design layout onto a substrate using a lithography apparatus, comprises: obtaining one or more rules that determine one or more characteristics of one or more assist features based on one or more parameters selected from a group consisting of one or more characteristics of one or more design features in the portion, one or more characteristics of the lithography process, one or more characteristics of the lithography apparatus, and a combination thereof; determining the one or more characteristics of the one or more assist features using the one or more rules; wherein the one or more parameters comprise a spacing between a pair of facing edges; placing the one or more assist features onto the design layout; wherein the one or more assist features are asymmetrical with respect to the pair of facing edges.

According to an embodiment, a computer-implemented method to improve a lithography process for imaging a portion of a design layout onto a substrate using a lithography apparatus, the portion comprising one or more assist features, comprises: obtaining one or more rules that adjust one or more characteristics of the assist features based on one or more parameters selected from a group consisting of one or more characteristics of one or more design features in the portion, one or more characteristics of the lithography process, one or more characteristics of the lithography apparatus, and a combination thereof; adjusting the one or more characteristics of the assist features using the one or more rules; wherein the one or more parameters comprise a spacing between a pair of facing edges; placing the one or more assist features onto the design layout; wherein the one or more assist features are asymmetrical with respect to the pair of facing edges.

According to an embodiment, a computer-implemented method to improve a lithography process for imaging a portion of a design layout onto a substrate using a lithography apparatus, comprises: obtaining one or more rules that determine one or more characteristics of one or more assist features based on one or more parameters selected from a group consisting of one or more characteristics of one or more design features in the portion, one or more characteristics of the lithography process, one or more characteristics of the lithography apparatus, and a combination thereof; determining the one or more characteristics of the one or more assist features using the one or more rules; wherein the one or more parameters comprise a spacing between a pair of facing edges; placing the one or more assist features onto the design layout; wherein the one or more assist features reduce tilt of Bossung curves of the portion.

According to an embodiment, a computer-implemented method to improve a lithography process for imaging a portion of a design layout onto a substrate using a lithography apparatus, the portion comprising one or more assist features, comprises: obtaining one or more rules that adjust one or more characteristics of the assist features based on one or more parameters selected from a group consisting of one or more characteristics of one or more design features in the portion, one or more characteristics of the lithography process, one or more characteristics of the lithography apparatus, and a combination thereof; adjusting the one or more characteristics of the assist features using the one or more rules; wherein the one or more parameters comprise a spacing between a pair of facing edges; placing the one or more assist features onto the design layout; wherein the one or more assist features reduce tilt of Bossung curves of the portion.

According to an embodiment, the method may further comprise representing the design layout with the one or more assist features on a patterning device.

According to an embodiment, a computer program product may comprise a non-transitory computer readable medium having the design layout with the one or more assist features recorded thereon.

The embodiments may further be described using the following clauses:

1. A method comprising:
obtaining at least a clip of a design layout; and
determining a representation of the clip on a patterning device, under a condition that a reduction ratio from the representation to the clip is anisotropic.
2. The method of clause 1, wherein the patterning device is a reflective patterning device.
3. The method of clause 1, wherein the patterning device is a transmissive patterning device.
4. The method of clause 1, wherein the patterning device is programmable.
5. The method of clause 1, further comprising: making or configuring the patterning device, based on the representation.
6. The method of clause 5, further comprising measuring the patterning device made or configured.
7. The method of clause 6, wherein measuring the patterning device comprises measuring a cutline length on a feature in the representation.
8. The method of clause 6, wherein measuring the patterning device comprises measuring a critical dimension (CD) on a feature in the representation.
9. The method of clause 6, wherein measuring the patterning device comprises measuring a angle on a feature in the representation.
10. The method of clause 1, further comprising simulating an image formed on a substrate by projecting the representation onto the substrate.
11. The method of clause 10, wherein the image is a resist image, an aerial image, or an etched image.
12. The method of clause 10, wherein simulating the image comprises modeling a source or projection optics of a patterning apparatus, or modeling interaction of light from the source with features in the representation.
13. The method of clause 10, further comprising adjusting a patterning apparatus or a patterning process based on the simulated image.
14. The method of clause 13, wherein adjusting the patterning apparatus comprises adjusting a source or projection optics of a lithography apparatus.
15. The method of clause 13, wherein adjusting the patterning process comprises adjusting a metric selected from a group consisting of focus, dose, scan speed, development, PEB, etching, and a combination thereof.
16. The method of clause 1, further comprising determining an interaction of light with the patterning device based on the representation.
17. The method of clause 16, wherein the interaction is scattering due to a finite height of features in the representation.
18. The method of clause 16, wherein the interaction is absorption of the light by features in the representation.
19. The method of clause 16, further comprising adjusting a patterning apparatus or a patterning process based on the interaction.
20. The method of clause 19, wherein adjusting the patterning apparatus comprises adjusting a source or projection optics of a lithography apparatus.
21. The method of clause 19, wherein adjusting the patterning process comprises adjusting a metric selected from a group consisting of focus, dose, scan speed, development, PEB, etching, and a combination thereof.
22. The method of clause 1, further comprising adjusting a patterning apparatus or a patterning process based on the representation.
23. The method of clause 22, wherein adjusting the patterning apparatus comprises adjusting a source or projection optics of a lithography apparatus.
24. The method of clause 22, wherein adjusting the patterning process comprises adjusting a metric selected from a group consisting of focus, dose, scan speed, development, PEB, etching, and a combination thereof.
25. A method comprising:
obtaining a relationship between:
a first geometric characteristic in a design layout or an image thereof, and
a second geometric characteristic in a representation of the design layout on a patterning device;
wherein the relationship is a function of an angle or an orientation of the first geometric characteristic, or a function of an angle or an orientation of the second geometric characteristic.
26. A method comprising:
obtaining a relationship between:
a first geometric characteristic in a design layout or an image thereof, and
a second geometric characteristic in a representation of the design layout on a patterning device;
wherein the relationship is a function involving reduction ratios in two different directions.
27. The method of any one of clauses 25 to 26, wherein the relationship is also between the first geometric characteristic and a fourth geometric characteristic in the representation of the design layout, or wherein the relationship is also between a third geometric characteristic in the design layout and the second geometric characteristic.
28. The method of any one of clauses 25 to 27, wherein the first geometric characteristic comprises a cutline length, a CD, or a change of CD.
29. The method of any one of clauses 25 to 27, wherein the second geometric characteristic comprises a cutline length, a CD, or a change of CD.
30. The method of any one of clauses 25 to 29, further comprising:
obtaining a value of the second geometric characteristic;
determining a value of the first geometric characteristic from the value of the second geometric characteristic, using the relationship.
31. The method of clause 30, further comprising adjusting a patterning apparatus or a patterning process based on the value of the first geometric characteristic.
32. The method of clause 31, wherein adjusting the patterning apparatus comprises adjusting a source or projection optics of a lithography apparatus.
33. The method of clause 31, wherein adjusting the design layout or the representation based on the value of the first geometric characteristic.

34. The method of clause 30, further comprising determining a location of measurement on the design layout or the image, based on the value of the first geometric characteristic.

35. The method of any one of clauses 25 to 29, further comprising:
obtaining a value of the first geometric characteristic;
determining a value of the second geometric characteristic from the value of the second geometric characteristic, using the relationship.

36. The method of clause 35, further comprising determining an interaction of light with the patterning device based on the value of the second geometric characteristic.

37. The method of clause 35, further comprising adjusting a patterning apparatus or a patterning process based on the value of the second geometric characteristic.

38. The method of clause 37, wherein adjusting the patterning apparatus comprises adjusting a source or projection optics of a lithography apparatus.

39. A computer program product comprising a non-transitory computer readable medium having instructions recorded thereon, the instructions when executed by a computer implementing the method of any of the above clauses.

Aspects of the invention can be implemented in any convenient form. For example, an embodiment may be implemented by one or more appropriate computer programs which may be carried on an appropriate carrier medium which may be a tangible carrier medium (e.g. a disk) or an intangible carrier medium (e.g. a communications signal). Embodiments of the invention may be implemented using suitable apparatus which may specifically take the form of a programmable computer running a computer program arranged to implement a method as described herein.

The descriptions above are intended to be illustrative, not limiting. Thus, it will be apparent to one skilled in the art that modifications may be made to the embodiments as described without departing from the scope of the claims set out below.

What is claimed is:

1. A method comprising:
obtaining at least a clip of a design layout; and
determining, by a hardware computer system, a representation of the clip on a patterning device, under a condition that a reduction ratio from the representation to the clip is anisotropic.

2. The method of claim 1, wherein the patterning device is a reflective patterning device.

3. The method of claim 1, further comprising making or configuring the patterning device, based on the representation.

4. The method of claim 3, further comprising measuring the patterning device made or configured.

5. The method of claim 4, wherein measuring the patterning device comprises measuring a cutline length on a feature in the representation, or wherein measuring the patterning device comprises measuring a critical dimension (CD) on a feature in the representation, or wherein measuring the patterning device comprises measuring an angle on a feature in the representation.

6. The method of claim 1, further comprising simulating an image formed on a substrate by simulating projecting of the representation onto the substrate.

7. The method of claim 6, wherein the image is a resist image, an aerial image, or an etched image.

8. The method of claim 6, wherein simulating the image comprises modeling a source or projection optics of a patterning apparatus, or modeling interaction of light from the source with features in the representation.

9. The method of claim 6, further comprising adjusting a patterning apparatus or a patterning process based on the simulated image.

10. The method of claim 6, further comprising adjusting a patterning apparatus based on the simulated image, wherein the adjusting the patterning apparatus comprises adjusting a source or projection optics of a lithography apparatus, or further comprising adjusting a patterning process based on the simulated image, wherein the adjusting the patterning process comprises adjusting focus, dose, scan speed, development, post-exposure bake, etching, or a combination selected therefrom.

11. The method of claim 1, further comprising determining an interaction of light with the patterning device based on the representation, wherein the interaction comprises scattering due to a finite height of features in the representation, or wherein the interaction comprises absorption of the light by features in the representation.

12. The method of claim 1, further comprising adjusting a patterning apparatus or a patterning process based on the representation.

13. The method of claim 1, further comprising adjusting a patterning apparatus based on the representation, wherein the adjusting the patterning apparatus comprises adjusting a source or projection optics of a lithography apparatus, or further comprising adjusting a patterning process based on the representation, wherein the adjusting the patterning process comprises focus, dose, scan speed, development, post-exposure bake, etching, or a combination selected therefrom.

14. A computer program product comprising a non-transitory computer readable medium having instructions therein, the instructions, when executed by a computer system, configured to cause the computer system to at least:
obtain at least a clip of a design layout; and
determine a representation of the clip on a patterning device, under a condition that a reduction ratio from the representation to the clip is anisotropic.

15. The computer program product of claim 14, wherein the patterning device is a reflective patterning device.

16. The computer program product of claim 14, wherein the instructions are further configured to cause the computer system to simulate an image formed on a substrate by simulation of projection of the representation onto the substrate.

17. The computer program product of claim 16, wherein the instructions are further configured to cause the computer system to adjust a patterning apparatus or a patterning process based on the simulated image.

18. The computer program product of claim 16, wherein the instructions configured to simulate the image are further configured to model a source or projection optics of a patterning apparatus, or model interaction of light from the source with features in the representation.

19. The computer program product of claim 14, wherein the instructions are further configured to cause the computer system to determine an interaction of light with the patterning device based on the representation, wherein the interaction comprises scattering due to a finite height of features in the representation, or wherein the interaction comprises absorption of the light by features in the representation.

20. The computer program product of claim 14, wherein the instructions are further configured to cause the computer system to adjust a patterning apparatus or a patterning process based on the representation.

* * * * *